United States Patent
Cuchiaro et al.

[11] Patent Number: 6,130,103
[45] Date of Patent: Oct. 10, 2000

[54] METHOD FOR FABRICATING FERROELECTRIC INTEGRATED CIRCUITS

[75] Inventors: Joseph D. Cuchiaro, Colorado Springs, Colo.; Akira Furuya, Tokyo, Japan; Carlos A. Paz de Araujo, Colorado Springs, Colo.; Yoichi Miyasaka, Tokyo, Japan

[73] Assignees: Symetrix Corporation, Colorado Springs, Colo.; NEC Corporation, Japan

[21] Appl. No.: 09/062,283

[22] Filed: Apr. 17, 1998

[51] Int. Cl.[7] ............... H01L 21/00; H01L 21/8242
[52] U.S. Cl. ........................... 438/3; 438/240
[58] Field of Search ........................ 438/3, 240, 253, 438/396; 257/295

[56] References Cited

U.S. PATENT DOCUMENTS

| | | | |
|---|---|---|---|
| 4,804,490 | 2/1989 | Pryor et al. ........................ | 438/796 |
| 5,434,102 | 7/1995 | Watanabe et al. ................. | 437/130 |
| 5,439,845 | 8/1995 | Watanabe et al. ................. | 437/130 |
| 5,481,490 | 1/1996 | Watanabe et al. ................. | 365/145 |
| 5,508,226 | 4/1996 | Ito et al. ............................ | 437/130 |
| 5,510,651 | 4/1996 | Maniar et al. ..................... | 257/751 |
| 5,523,595 | 6/1996 | Takenaka et al. .................. | 257/295 |
| 5,716,875 | 2/1998 | Jones, Jr. et al. .................. | 438/3 |
| 5,784,310 | 7/1998 | Cuchiaro et al. .................. | 365/145 |
| 5,792,592 | 8/1998 | Uchida et al. ..................... | 430/313 |
| 5,864,153 | 1/1999 | Nagel et al. ....................... | 257/295 |

OTHER PUBLICATIONS

Article: H. Achard and H. Mace; "Integration of Ferroelectric Thin Films For Memory Applications"; Science and Technology of Electroceramic Thin Films; Kluwer Academic Publishers, 1995; pp. 353–372, inclusive, No Month.

Symposium Abstract: Ilsub Chung, et al.; "Integration of Ferroelectric Capacitors Using Multilayered Electrode"; The Tenth International Symposium on the Applications of Ferroelectrics, Aug. 18–21, 1996, Hilton Hotel, East Brunswick, NJ, Rutgers University; p. 55.

Symposium Abstract: Takashi Hase, et al.; "Analysis of the Degradation of PZT and $SrBi_2Ta_2O_9$ Thin Films With A Reductive Process"; The Eighth International Symposium on Integrated Ferroelectrics, Mar. 18–20, 1996, Tempe, AZ; Plenary Talks, Invited Lectures and Contributed Papers.

*Primary Examiner*—Brian Dutton
*Attorney, Agent, or Firm*—Duft, Graziano & Forest, P.C.

[57] ABSTRACT

An integrated circuit is formed that contains a ferroelectric element comprising metal oxide material containing at least two metals. Various methods and structures are applied to minimize the degradation of ferroelectric properties caused by hydrogen during fabrication of the circuit. Oxygen is added to the some elements of the integrated circuit to serve as a getter of hydrogen during fabrication steps. To minimize hydrogen degradation, the ferroelectric compound can be fabricated from a liquid precursor containing one or more of the constituent metals in excess of the amount corresponding to a stoichiometrically balanced concentration. A hydrogen barrier layer, preferably comprising titanium nitride, is formed to cover the top of the ferroelectric element. A hydrogen heat treatment in hydrogen gas is performed on the integrated circuit at a temperature from 200° to 350° C. and for a time period not exceeding 30 minutes to minimize degradation of the ferroelectric properties by hydrogen while restoring other properties of the integrated circuit. An oxygen recovery anneal at 800° C. after high-energy hydrogen steps restores ferroelectric properties.

35 Claims, 12 Drawing Sheets

METHOD FOR FABRICATING FERROELECTRIC INTEGRATED CIRCUITS

BACKGROUND OF THE INVENTION

1. Field of the Invention

The invention in general relates to the fabrication of layered superlattice materials and $ABO_3$ type metal oxides, and more particularly to a method for fabricating ferroelectric integrated circuits that protects the elements of ferroelectric devices from damage by hydrogen.

2. Statement of the Problem

Ferroelectric compounds possess favorable characteristics for use in nonvolatile integrated circuit memories. See Miller, U.S. Pat. No. 5,046,043. A ferroelectric device, such as a capacitor, is useful as a nonvolatile memory when it possesses desired electronic characteristics, such as high residual polarization, good coercive field, high fatigue resistance, and low leakage current. Lead-containing $ABO_3$ type ferroelectric metal oxides such as PZT (lead titanate zirconate) and PLZT (lanthanum lead titanate zirconate) have been studied for practical use in integrated circuits. Layered superlattice materials have also been studied for use in integrated circuits. See Watanabe, U.S. Pat. No. 5,434,102. Layered superlattice material compounds exhibit characteristics in ferroelectric memories that are orders of magnitude superior to those of PZT and PLZT compounds. While prototypes of ferroelectric memories have been made successfully with the layered superlattice compounds, there is as yet no manufacturing process for making memories using either the $ABO_3$ type oxides or the layered superlattice material compounds with the desired electronic characteristics economically and in commercial quantities. One reason, among others, for the lack of economical commercial processes for the fabrication of high quality ferroelectric integrated circuits is that the metal oxide compounds are susceptible to reduction by hydrogen during hydrogen annealing. Hydrogen annealing is a common step during CMOS integrated circuit memory fabrication and results in degradation of some important ferroelectric properties. This is especially true for the layered superlattice material compounds, which are complex, layered oxides that are especially prone to degradation by hydrogen.

A typical ferroelectric memory device in an integrated circuit contains a semiconductor substrate and a metal-oxide semiconductor field-effect transistor (MOSFET) in electrical contact with a ferroelectric device, usually a ferroelectric capacitor. A ferroelectric capacitor typically contains a ferroelectric thin film located between a first, bottom electrode and a second, top electrode, the electrodes typically containing platinum. During manufacture of the circuit, the MOSFET is subjected to conditions causing defects in the silicon substrate. For example, the manufacturing process usually includes high energy steps, such as ion-mill etching and plasma etching. Defects also arise during heat treatment for crystallization of the ferroelectric thin film at relatively high temperatures, often in the range 500°–900° C. As a result, numerous defects are generated in the single crystal structure of the semiconductor silicon substrate, leading to deterioration in the electronic characteristics of the MOSFET.

To restore the silicon properties of the MOSFET/CMOS, the manufacturing process typically includes a hydrogen annealing step, in which defects such as dangling bonds are eliminated by utilizing the reducing property of hydrogen. Various techniques have been developed to effect the hydrogen annealing, such as $H_2$-gas heat treatment in ambient conditions. Conventionally, hydrogen treatments are conducted between 350° and 550° C., typically around 450° C. for a time period of about 30 minutes. In addition, there are several other integrated circuit fabrication processes that expose the integrated circuit to hydrogen, often at elevated temperatures, such as CVD processes for depositing metals, and growth of silicon dioxide from silane or TEOS sources. During processes that involve hydrogen, the hydrogen diffuses through the top electrode and the side of the capacitor to the ferroelectric thin film and reduces the metal oxides contained in the ferroelectric material. The absorbed hydrogen also metallizes the surface of the ferroelectric thin film. The adhesivity of the ferroelectric thin film to the upper electrode is lowered by the chemical change taking place at the interface. Alternatively, the upper electrode is pushed up by the oxygen gas, water, and other products of the oxidation-reduction reactions taking place. As a result of these effects, the electronic properties of the capacitor are degraded, and peeling is likely to take place at the interface between the top electrode and the ferroelectric thin film. In addition, hydrogen also can reach the lower electrode, leading to internal stresses that cause the capacitor to peel off its substrate. These problems are acute in ferroelectric memories containing layered superlattice compounds because these metal oxide compounds are particularly complex and prone to degradation by hydrogen-reduction.

3. Solution to the Problem

The present invention provides a process for fabricating thin films of layered superlattice materials and $ABO_3$ type metal oxides for use in integrated circuits that reduces the detrimental effects of the hydrogen heat treatment and preserves the favorable electronic properties of the ferroelectric element.

One aspect of the invention is an $H_2$-gas treatment step conducted at relatively low temperatures, in the range 200°–350° C.

Another aspect of the invention is that the $H_2$-treatment is conducted for a short time period, less than 30 minutes.

The relative concentration of hydrogen gas is in the range 0.01 to 50 percent. The heat treatment is ambient tolerant so that it can be conducted, for example, at atmospheric pressure and in the presence of nitrogen or other inert gases.

In a preferred method, a nitride of titanium or silicon is formed to cover the ferroelectric element and serve as a hydrogen barrier.

A further aspect of the invention is forming an integrated circuit element containing a thin film of oxide material containing at least two metals. In a preferred embodiment, the thin film comprises a layered superlattice compound. Preferably, at least one of the metals is present in the oxide material in an excess amount. A further aspect of the invention is forming ferroelectric material in which at least one of the constituent metals is present in amounts sufficient to form separate metal oxides in the ferroelectric material. In one embodiment of the invention the layered superlattice compound comprises strontium bismuth tantalum niobate. Another aspect of the invention is a method wherein the metal present in an excess amount is either niobium or bismuth. A further aspect of the invention is forming a metal oxide element having layered superlattice compounds containing the chemical elements bismuth, niobium and tantalum in which the relative amounts of the chemical elements are selected to minimize the degradation of electronic properties by hydrogen.

Another aspect of the invention is providing a substrate and a precursor liquid for the oxide material, applying the precursor to the substrate and treating it to form the oxide material. Another aspect of the invention is that the oxide material comprises an oxide compound containing at least two metals. A further aspect of the invention is that at least one of the metals is present in the precursor in an excess amount. A still further aspect of the invention is that a metal present in an excess amount is a metal that does not form volatile compounds that dissipate during said fabrication process.

Another aspect of the invention is that the oxide material comprises strontium bismuth tantalum niobate and the precursor contains the chemical elements strontium, bismuth, tantalum and niobium having relative molar proportions corresponding approximately to the stoichiometric formula $SrBi_{2.18}Ta_{2-x}Nb_xO_9$, where $0 \leq x \leq 2$. In one embodiment, the precursor contains an additional amount of bismuth corresponding to between zero percent and 40 percent above the stoichiometric amount represented by the formula $SrBi_{2.18}Ta_{2-x}Nb_xO_9$, where $0 \leq x \leq 2$. In one embodiment, the precursor contains relative molar proportions of the elements strontium, bismuth, tantalum and niobium corresponding approximately to the formula $SrBi_{2.18}Ta_{1.44}Nb_{0.56}O_9$. In a preferred embodiment, layered superlattice material contains an additional amount of niobium corresponding to between zero percent and 40 percent above the stoichiometric amount represented by the formula $SrBi_{2.18}Ta_{1.44}Nb_{0.56}O_9$.

A further aspect of the invention is performing an oxygen-gas recovery anneal at a temperature range from 300° to 1000° C. for a time period from 20 minutes to 2 hours to restore desired electronic properties that degrade during hydrogen treatments.

The invention provides a process and IC structure that permits ferroelectric electronic elements, particularly elements made with the layered superlattice material compounds, to be made in commercial quantities without significant degradation of their electronic properties. Numerous other features, objects and advantages of the invention will become apparent from the following description when read in conjunction with the accompanying drawings.

DETAILED DESCRIPTION OF THE PREFERRED EMBODIMENT

1. Overview

Figure 1:
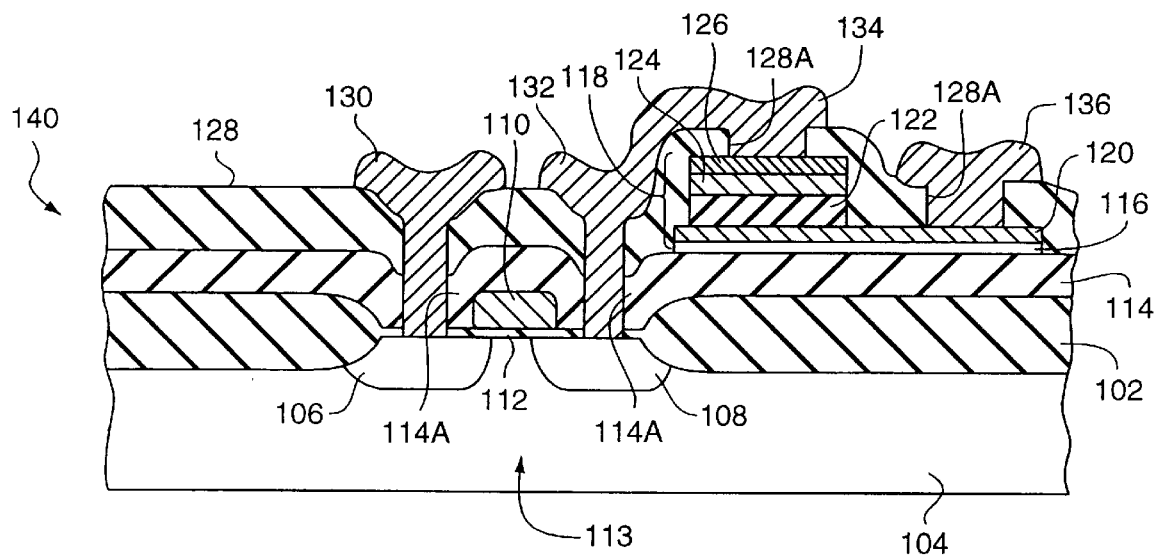
FIG. 1 is a cross-sectional view of a portion of an integrated circuit as may be fabricated by the method of the invention showing a nonvolatile ferroelectric memory cell.
Figure 3:
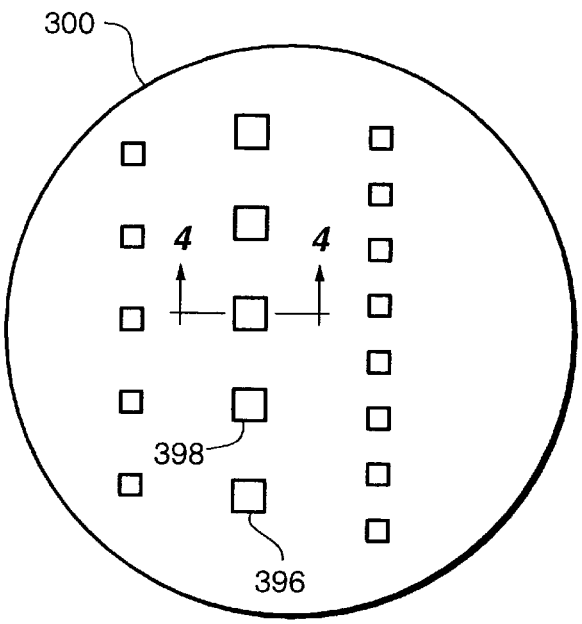
FIG. 3 is a top view of an exemplary wafer on which thin film capacitors fabricated in accordance with the invention are shown greatly enlarged.
Figure 4:
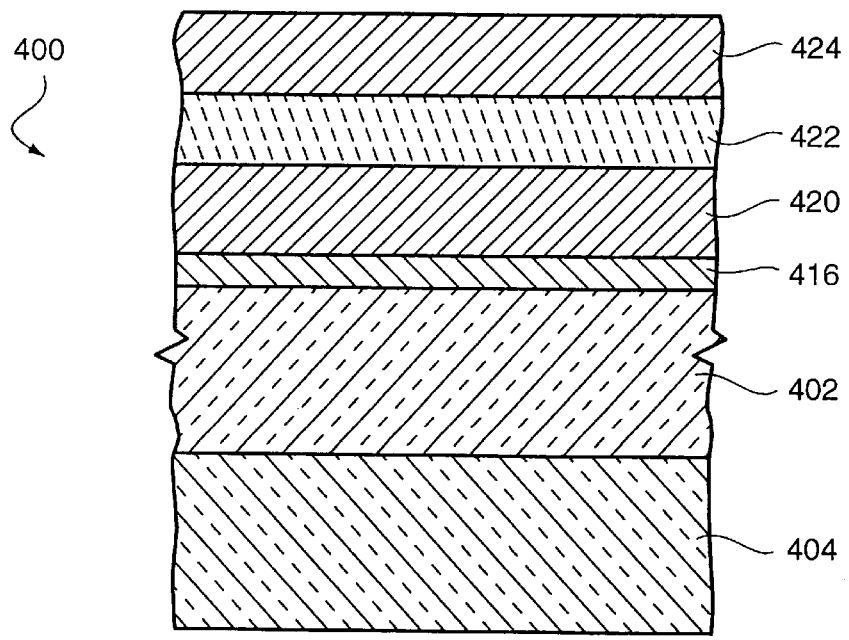
FIG. 4 is a portion of a cross-section of FIG. 3 taken through the lines 4—4, illustrating a thin film capacitor device fabricated in accordance with the invention.

It should be understood that the FIGS. 1, 3 and 4 depicting ferroelectric integrated circuit devices are not meant to be actual plan or cross-sectional views of any particular portion of an actual integrated circuit device. In the actual devices the layers will not be as regular and the thickness may have different proportions. The various layers in actual devices often are curved and possess overlapping edges. The figures instead show idealized representations which are employed to depict more clearly and fully the structure and process of the invention than would otherwise be possible. Also, the figures represent only one of innumerable variations of ferroelectric devices that could be fabricated using the method of the invention. FIG. 1 depicts a ferroelectric memory containing a switch in the form of a field effect transistor in electrical connection with a ferroelectric capacitor. But, it would also be conceivable to use the method of this invention to fabricate a ferroelectric FET memory in which the ferroelectric element is incorporated in the switch element. Such a ferroelectric FET is described in McMillan, U.S. Pat. No. 5,523,964, which is incorporated herein by reference. Likewise, other integrated circuits fabricated using the method of the invention could include other elements and compositions of material.

Directing attention to FIG. 1, there is shown a cross-sectional view of an exemplary nonvolatile ferroelectric memory cell that could be fabricated according to the method of the invention. The general manufacturing steps for fabricating integrated circuits containing MOSFETs and ferroelectric capacitor elements is described in Yoshimori, U.S. Pat. No. 5,561,307, which is hereby incorporated by reference as if completely contained herein. General fabrication methods have been described in other references also. Therefore, the elements of the circuit of FIG. 1 will be simply identified here.

In FIG. 1, a field oxide region 102 is formed on a surface of a silicon substrate 104. A source region 106 and a drain region 108 are formed separately from each other within silicon substrate 104. A gate insulating layer 112 is formed on the silicon substrate 104 between the source and drain regions 106 and 108. Further, a gate electrode 110 is formed on the gate insulating layer 112. These source region 106, drain region 108, gate insulating layer 112 and gate electrode 110 together form a MOSFET 113.

An interlayer dielectric layer (ILD) 114 made of BPSG (boron-doped phosphosilicate glass) is formed on substrate 104 and field oxide region 102. An adhesive layer 116 is formed on a portion of ILD 114, and then a ferroelectric thin film capacitor 118 is formed on adhesive layer 116. The adhesive layer 116 is made of, for example, titanium, and typically has a thickness of 200 Å.

Ferroelectric capacitor 118 is preferably formed on a conventional wafer 140 that may comprise silicon, gallium arsenide or other semiconductor, or an insulator, such as silicon dioxide, glass or magnesium oxide (MgO). The bottom and top electrodes of ferroelectric capacitors conventionally contain platinum. It is preferable that the bottom electrode contains a non-oxidized precious metal such as platinum, palladium, silver, and gold. In addition to the precious metal, metal such as aluminum, aluminum alloy, aluminum silicon, aluminum nickel, nickel alloy, copper alloy, and aluminum copper may be used for electrodes of a ferroelectric memory. Adhesive layers, such as titanium, enhance the adhesion of the electrodes to adjacent underlying or overlying layers of the circuits.

In FIG. 1, the ferroelectric capacitor 118 comprises a bottom electrode 120 made of platinum and having a thickness of 2000 Å (angstroms), a ferroelectric thin film 122 formed on the bottom electrode 120, a top electrode 124 formed on the ferroelectric film 122, made of platinum and having a thickness of 2000 Å, and preferably an electrically conductive hydrogen barrier layer 126 formed on the top electrode and having a thickness of 500–2000 Å. The hydrogen barrier layer 126 can comprise a single film, for example, titanium nitride or silicon nitride, or it can contain two or more films, for example, a bottom film of titanium, then a film of titanium nitride followed by a titanium film. If the barrier layer 126 is made from electrically conductive material, such as titanium nitride, and acts as a conducting element, then it can be patterned with the top electrode 124 so that barrier layer 126 and top electrode 124 are self-aligning. The hydrogen barrier layer can be deposited using a conventional sputtering technique. The composition and structure of the ferroelectric thin film 122 is discussed in more detail below.

A second interlayer dielectric layer 128 made of NSG (nondoped silicate glass) is formed on ILD 114. A PSG (phospho-silicate glass) film or a BPSG film could also be used in ILD 128. Openings 114a are selectively opened through ILD 128 to expose the source region 16 and gate region 18. Source electrode wiring 130 and drain electrode wiring 132 are formed to fill openings 114a. Other openings 128a are selectively opened through ILD 128 to expose the electrically conductive hydrogen barrier layer 126 and the bottom electrode 120. Top electrode wiring 134 and bottom electrode wiring 136 are formed to fill these openings 128a. The drain electrode wiring 132 is electrically connected to top electrode wiring 134. Each of these wirings 130, 132, 134 and 136 is made of Al-Si-Cu (1% Si, 0.5% Cu) with a thickness of about 3000 Å. If barrier layer 126 is nonconductive, then it is necessary to remove at least a portion of the barrier layer 126 so that the wiring layer 134 can make electrical contact to top electrode 124.

The composition of the ferroelectric thin film 122 can be selected from a group of suitable ferroelectric materials, including but not limited to: an $ABO_3$-type metal oxide perovskite, such as a titanate (e.g., $BaTiO_3$, $SrTiO_3$, $PbTiO_3$ (PT), $PbZrTiO_3$ (PZT)) or a niobate (e.g., $KNbO_3$), and, preferably, a layered superlattice compound.

$ABO_3$ type metal oxides are a well-known group of ferroelectric and high dielectric constant materials. See, for example, Franco Jona and G. Shirane, *Ferroelectric Crystals,* Dover Publications, N.Y., p. 108. U.S. Pat. No. 5,519,234 issued May 21, 1996, incorporated herein by reference, discloses that layered superlattice compounds, such as strontium bismuth tantalate, have excellent properties in ferroelectric applications as compared to the best prior materials and have high dielectric constants and low leakage currents. U.S. Pat. Nos. 5,434,102 issued Jul. 18, 1995 and 5,468,684 issued Nov. 21, 1995, incorporated herein by reference, describe processes for integrating these materials into practical integrated circuits.

The layered superlattice materials may be summarized generally under the formula:(1)

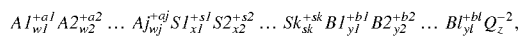

Where A1, A2 . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . BI represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the A-sites are occupied by a strontium atom and 25% of the A-sites are occupied by a barium atom. If there is only one A-site element in the compound then it is represented by the "A1" element and w2 . . . wj all equal zero. If there is only one B-site element in the compound, then it is represented by the "B1" element, and y2 . . . y1 all equal zero, and similarly for the superlattice generator elements. The usual case is that there is one A-site element, one superlaftice generator element, and one or two B-site elements, although formula (1) is written in the more general form since the invention is intended to include the cases where either of the sites and the superlattice generator can have multiple elements. The value of z is found from the equation:

$(a1w1+a2W2 \ldots +ajw)+(s1x1+s2x2 \ldots +skxk)+(b1y1+b2y2 \ldots +bly)=2z.$ (2)

Formula (1) includes all three of the Smolenskii type compounds discussed in U.S. Pat. No. 5,519,234 issued May 21, 1996, which is hereby incorporated by reference as though fully incorporated herein. The layered superlattice materials do not include every material that can be fit into the formula (1), but only those which spontaneously form themselves into crystalline structures with distinct alternating layers.

The word "substrate" can mean the underlying wafer 104 on which the integrated circuit is formed, as well as any object on which a thin film layer is deposited, such as BPSG layer 114. In this disclosure "substrate" shall mean the object to which the layer of interest is applied; for example, when we are talking about a bottom electrode, such as 120, the substrate includes the layers 116 and 114 on which the electrode 120 is formed.

The term "thin film" is used herein as it is used in the integrated circuit art. Generally it means a film of less than a micron in thickness. The thin films disclosed herein are in all instances less than 0.5 microns in thickness. Preferably the ferroelectric thin films 124 are 1000 Å to 3000 Å thick, and most preferably 1200 Å to 2500 Å thick. These thin films of the integrated circuit art should not be confused with the layered capacitors of the macroscopic capacitor art which are formed by a wholly different process which is incompatible with the integrated circuit art.

The term "stoichiometric" herein, may be applied to both a solid film of a material, such as a layered superlattice material, or to the precursor for forming a material. When it is applied to a solid thin film, it refers to a formula in which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2TaNbO_9$ and $SrBi_2Ta_{1.44}Nb_{0.56}O_9$ are balanced stoichiometric formulas. In contrast, a precursor for strontium bismuth tantalum niobate in which the molar proportions of strontium, bismuth, tantalum, and niobium are 1, 2.18, 1.44, and 0.56, respectively, is represented herein by the unbalanced "stoichiometric" formula $SrBi_{2.18}Ta_{1.44}Nb_{0.56}O_9$, since it contains excess bismuth beyond what is needed to form a complete crystalline material. In this disclosure an "excess" amount of a metallic element means an amount greater than required to bond with the other metals present to make the desired material, with all atomic sites occupied and no amount of any metal left over. However, as known in the art, because bismuth oxide is highly volatile and significant heat is used in fabricating electronic devices according to the invention, the molar proportion of bismuth in a solid ferroelectric layer 122, 422, made according to the process of the invention will generally be less than that in the stoichiometric formula for the precursor. However, the molar proportions of strontium, tantalum, and niobium in ferroelectric layer 122, 422, made according to the process of the invention will be very close or identical to the molar proportions given in the stoichiometric formula for the precursor. See U.S. Pat. No. 5,434,102 issued to Watanabe et al.

Based on the Watanabe et al. 5,434,102 patent and related work, the precursor for making layered superlattice materials preferred by those skilled in the art presently has the stoichiometric formula $SrBi_{2.18}Ta_{1.44}Nb_{0.56}O_9$. It is believed that a precursor with this formula will result in final solid strontium bismuth tantalum niobate thin film with the balanced stoichiometric formula $SrBi_2Ta_{1.44}Nb_{0.56}O_9$. That is, the final thin film does not contain excess bismuth because the excess bismuth in the precursor is carried away as bismuth oxide gas during the fabrication process. The ferroelectric layers 422 described in examples below were fabricated from a strontium bismuth tantalum niobate solution commercially available from Hughes Aircraft Company, Product No. HAC10475-47. This precursor solution contains amounts of chemical precursors corresponding to the stoichiometric ratio $SrBi_{2.18}Ta_{1.44}Nb_{0.56}O_9$. This stoichiometric formula is referred to herein as the "standard" formula having the "standard" ratio of niobium to tantalum. A precursor having the standard stoichiometric formula includes about 9% excess bismuth. That is, the standard stoichiometric formula includes an amount of bismuth above what is required to bond with all the strontium, tantalum and niobium in the precursor to form a layered superlattice compound with all atomic sites in the crystal occupied. A key feature of the invention is that a final layered superlattice compound with excess metal, that is amounts of at least one metal, such as bismuth and niobium, above or in addition to that shown in the standard formula is more resistant to degradation by hydrogen than material made with a precursor having the standard formula. A related key feature is that excess amounts of a B-site element, such as niobium, in a layered superlattice material are effective in preventing the degradation of the electronic properties by exposure to hydrogen.

Figure 2:
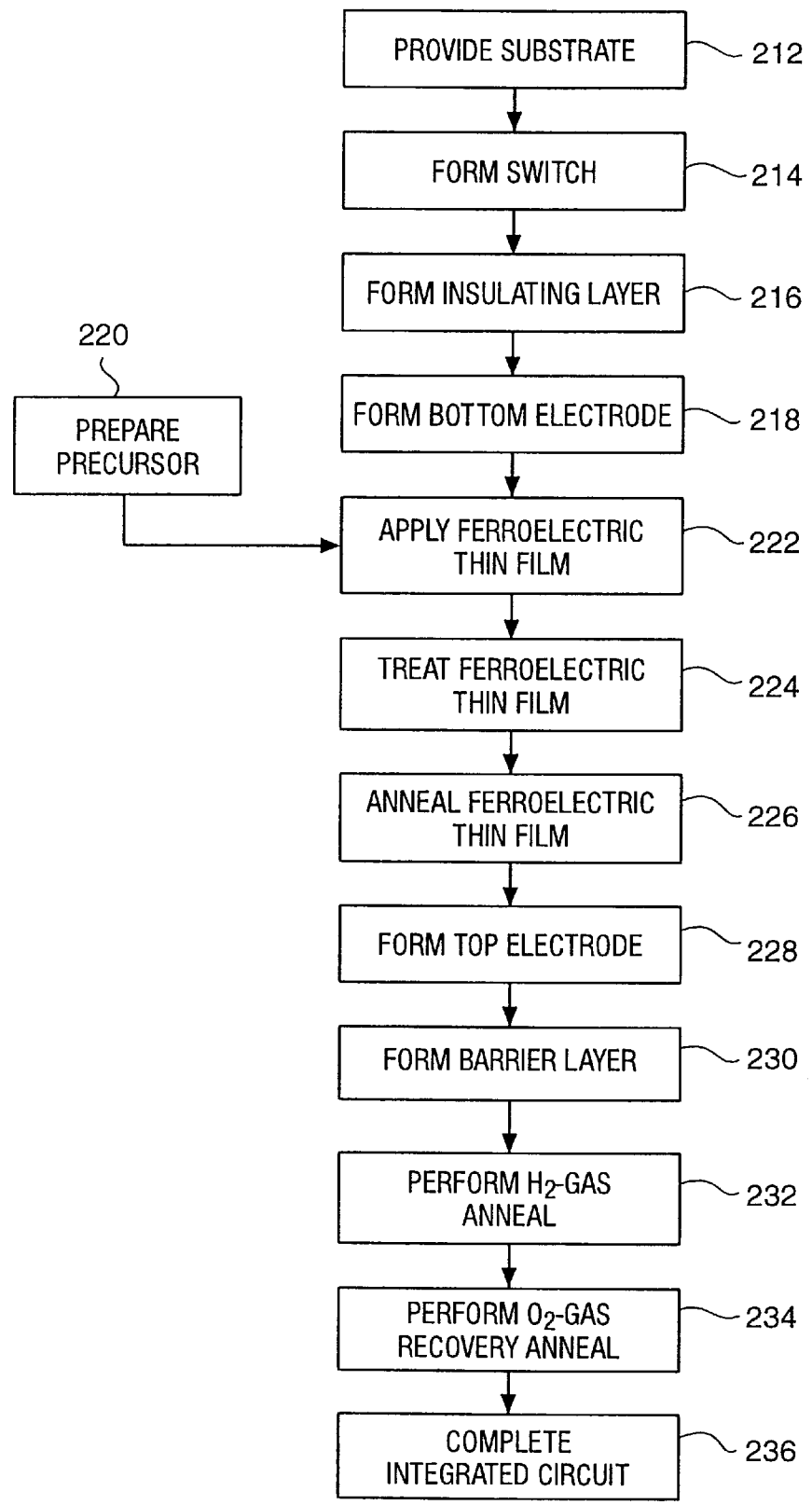
FIG. 2 is a flow chart showing the preferred embodiment of a process for fabricating a nonvolatile ferroelectric memory device according to the invention.

The diagram of FIG. 2 is a flow sheet of the fabrication steps used in this invention to make a ferroelectric memory. In step 212, a semiconductor substrate is provided on which a switch is formed in step 214. The switch is typically a MOSFET. In step 216, an insulating layer is formed to separate the switching element from the ferroelectric element to be formed. In step 218, a bottom electrode is formed. Preferably the electrode is made of platinum and is sputter-deposited to form a layer with a thickness of about 2000 Å. In the preferred method, an adhesion layer made of titanium or titanium nitride of about 200 Å would be formed in this step prior to depositing the electrode. The ferroelectric thin film is applied to the bottom electrode in step 222. In the preferred method, the ferroelectric thin film contains layered superlattice compounds. The ferroelectric thin films are preferably applied using a liquid deposition technique, such as spin-coating or a misted deposition method as described in U.S. Pat. No. 5,546,945. In the most preferred method, a spin-on technique is used to form the thin film. In step 220, chemical precursors of the layered superlattice compounds that will form the desired ferroelectric thin film are prepared. Usually, a final precursor solution is prepared from commercially available solutions containing the chemical precursor compounds. Preferably, the concentrations of the various precursors supplied in the commercial solutions are adjusted in step 220 to accommodate particular manufacturing or operating conditions. For example, the stoichiometric amounts of the various elements in a typical commercial solution for a layered superlattice thin film might be $SrBi_{2.18}Ta_{1.44}Nb_{0.56}O_9$. As will be seen below, it often is desirable, however, to add extra niobium or bismuth to this solution to generate extra oxides that will protect the ferroelectric compounds from hydrogen-annealing degradation. The application step 222 is preferably followed by a treatment step 224 which preferably includes a drying step, a crystallization substep at elevated temperatures such as a rapid thermal process, and may include treatment with ultraviolet radiation during or after the application step 222. For example, in a typical spin-on procedure, a coat of the precursor might be applied and dried. Then another precursor coat might be applied and dried. The treated film is then annealed in oxygen to form the resulting ferroelectric thin film in step 226. The application and treatment steps 222 and 224 can be repeated several times. Following steps 222–226, the top electrode is formed in step 228. Step 228 and other steps would include substeps, such as ion etching and ashing. In the preferred method, a hydrogen barrier layer is formed in step 230 to cover at least the top electrode of the capacitor. Typically, the hydrogen barrier layer is titanium nitride, which inhibits diffusion of hydrogen into the ferroelectric and which is also electrically conductive. It is also desirable to add a small amount of oxygen to the barrier layer by including a small amount of $O_2$-gas in the sputter atmosphere during sputter-deposition of the barrier layer. The resulting oxides that form in the barrier layer protect the ferroelectric compounds in the memory device by reacting with the hydrogen that can be present in various manufacturing process steps. In step 232, hydrogen annealing of the workpiece is conducted at a temperature and annealing time chosen to satisfactorily eliminate the defects caused in the silicon substrate by oxidation and to minimize hydrogen degradation of the ferroelectric compounds. The hydrogen annealing step is preferably performed with $H_2$-gas in ambient conditions because this is less complex than other alternatives. In step 234, an oxygen-recovery anneal is performed to restore the electronic properties of the ferroelectric element that were degraded as a result of hydrogen annealing and other process steps causing reducing conditions. The circuit would be completed in step 236, which could include a number of substeps, for example, deposition of an ILD, patterning and milling, and deposition of wiring layers.

Experiments have demonstrated that $H_2$-gas annealing at 200° C. for about 10 minutes very effectively inhibits the degradation of electronic properties in the ferroelectric element compared to the damage done by hydrogen annealing at higher temperatures and longer duration. Nevertheless, it might not always be possible under such conditions to accomplish the purpose of the hydrogen heat treatment, that is, the repair of surface states in transistors damaged by oxidation. Furthermore, such conditions alone might not be sufficient to protect adequately the ferroelectric compounds from hydrogen degradation. For these reasons, the method of the invention contemplates the use of various steps to protect the memory device from damage from hydrogen. These steps can be used in conjunction with or instead of a low-temperature short-duration hydrogen heat treatment.

In the preferred method of the present invention, the hydrogen heat treatment of the integrated circuit is conducted under ambient conditions in a $H_2$-$N_2$ gas mixture with 1–5 percent (1–5%) $H_2$, at a temperature of 200° C. for 10 minutes. The beneficial effects of the low-temperature, short-duration hydrogen heat treatment are significant up to a temperature of 350° C. and a duration of 30 minutes. The hydrogen heat treatment of the invention can be performed in a hydrogen atmosphere in which the volume percent of hydrogen gas is in the range from 0.01 to 50 percent. This is because diffusion of hydrogen in the integrated circuit is a dominant step.

Experiments described in more detail below have shown that the low-temperature short-duration hydrogen annealing method of the present invention is effective in protecting the electronic characteristics of nonvolatile ferroelectric capacitors in which the ferroelectric thin film contains Bi-layered superlattice material made from a precursor with a composition corresponding approximately to the general formula $SrBi_{2.18}Ta_{2-x}Nb_x$, where $0 \leq x \leq 2$. Experiments have also shown that the low-temperature short-duration hydrogen heat treatment is most effective in protecting superlattice compounds made from a precursor solution with a composition corresponding approximately to the general stoichiometric formula $SrBi_{2.18}Ta_{1.44}Nb_{0.56}O_9$, in which the mole ratio Nb/Ta in the precursor is about 0.4. Experiments have further shown that addition of bismuth or niobium to the precursor in excess of the relative amounts corresponding to the formula $SrBi_{2.18}Ta_{1.44}Nb_{0.56}O_9$ is effective in protecting desired electronic characteristics from hydrogen degradation. The preferred method of the invention provides a ferroelectric capacitor in which at least the top electrode is covered by a hydrogen barrier layer, preferably containing titanium nitride. Hydrogen degradation of the ferroelectric properties can also be partially or fully reversed to regain good electronic characteristics by means of oxygen recovery annealing.

Experiments have shown that lateral diffusion of the hydrogen, that is, diffusion in a direction parallel to the plane of the ferroelectric film is not significant compared with diffusion in a direction normal to the plane of the ferroelectric film. It is believed that a very small portion of the ferroelectric material at the lateral edges of the ferroelectric layer 124, 422 acts as a getter for any hydrogen that may penetrate in the lateral direction and protects the rest of the material from hydrogen.

In a typical manufacturing sequence, the hydrogen heat treatment is conducted before the circuit wiring has been deposited and patterned. Other process sequences and steps may also be used. For example, holes for the MOSFET contact wiring can be opened before hydrogen treatment, while holes through the ILD layers to the electrodes of the ferroelectric element can be made after the hydrogen heat treatment step.

FIG. 3 is a top view of an exemplary wafer on which thin film capacitors 396, 398 and 400 fabricated on substrate 300 in accordance with the invention are shown greatly enlarged. FIG. 4 is a portion of a cross-section of FIG. 3 taken through the lines 4—4, illustrating a thin film capacitor device fabricated in accordance with the invention. A silicon dioxide layer 402 is formed on a silicon crystal substrate 404. A titanium adhesion layer 416 is formed on the silicon dioxide layer 402. Then bottom electrode 420 made of platinum is sputter-deposited on adhesion layer 416. Layer 422 is a ferroelectric thin film, and layer 424 represents the top electrode made of platinum.

EXAMPLE 1

The electronic properties of strontium bismuth tantalum niobate capacitors were studied before and after annealing in $H_2$-gas at temperatures of 200°, 250° and 300° C. for 10, 30 and 60 minutes. The capacitors were fabricated from a strontium bismuth tantalum niobate solution commercially available from Hughes Aircraft Company, Product No. HAC10475-47. The solution contained amounts of chemical precursors corresponding to the stoichiometric formula $SrBi_{2.18}Ta_{1.44}Nb_{0.56}O_9$. This stoichiometric formula is referred to in this and the other examples as the "standard" concentration. It should be understood, however, that the formula merely represents the relative ratios of the various chemical species in the commercially available precursor solutions. The 0.2 mol/l solution in this example contained: tantalum 2-ethylhexanoate, bismuth 2-ethylhexanoate, strontium 2-ethylhexanoate, niobium 2-ethylhexanoate, 2-ethylhexanoate, and xylene. Ferroelectric capacitors containing the layered superlattice compound was formed from the precursor solution in general accordance with the method described in Watanabe, U.S. Pat. No. 5,434,102, which is hereby incorporated by reference as if wholly contained herein. Remanent polarization (2Pr), coercive field ($E_C$), and leakage current in the capacitors were measured before and after hydrogen treatment.

A series of p-type 100 Si wafer substrates 404 were oxidized to form a layer of silicon dioxide 402. A titanium adhesive layer 416 of 200 Å thickness was sputtered on the substrate, then a bottom platinum electrode 420 of 3000 Å thickness was sputter-deposited on adhesive layer 416. These were annealed 30 minutes in $O_2$ at 650° C., and dehydrated 30 minutes at 180° C. in low vacuum. A spincoat of 0.2 molar solution of the strontium bismuth tantalum niobate compound was deposited on the bottom electrode 420 at 1500 rpm for 30 seconds. This was pyrolized for 1 minute at 160° C., increasing to 260° C. for 4 minutes. The sequence of the spincoat and pyrolysis steps was repeated. The ferroelectric coating was crystallized using rapid-thermal-annealing (RTA 725° C. 30 sec, 100° C./sec). These steps formed a ferroelectric thin film 422 having a thickness of 2100±150 Å. The wafer and deposited layers were given a first anneal for 60 minutes at 800° C. Platinum was sputter-deposited to make a top electrode layer 424 with 2000 Å thickness, followed by PR treatment. The platinum and strontium bismuth tantalum niobate layers were ion etched to form the capacitors, and then ashing was performed to remove the photoresist mask, followed by a second $O_2$ anneal for 30 minutes at 800° C.

Before the capacitors were annealed in hydrogen gas, the electronic properties of five capacitors, each with an area of 7854 $\mu m^2$, were measured. The leakage current in the capacitors was about $10^{-7}$ A/cm$^2$ at 5 volts. Remanent polarization (2Pr) measured at 5 volts was about 23 $\mu C/cm^2$. In the fatigue test which was performed on one of the capacitors, the 2Pr value reduced about 5 percent after $10^{10}$ cycles.

Hydrogen annealing was then performed on capacitors in a $H_2$-$N_2$ ($H_2$ 1%) mixture under ambient conditions, at 200°, 250°, and 300° C. for 10, 30, and 60 minutes. The surface areas of the samples generally were again 7854 $\mu m^2$; however, the effect of the hydrogen heat treatment on remanent polarization was also measured and compared in capacitors of different surface areas.

Figure 5:
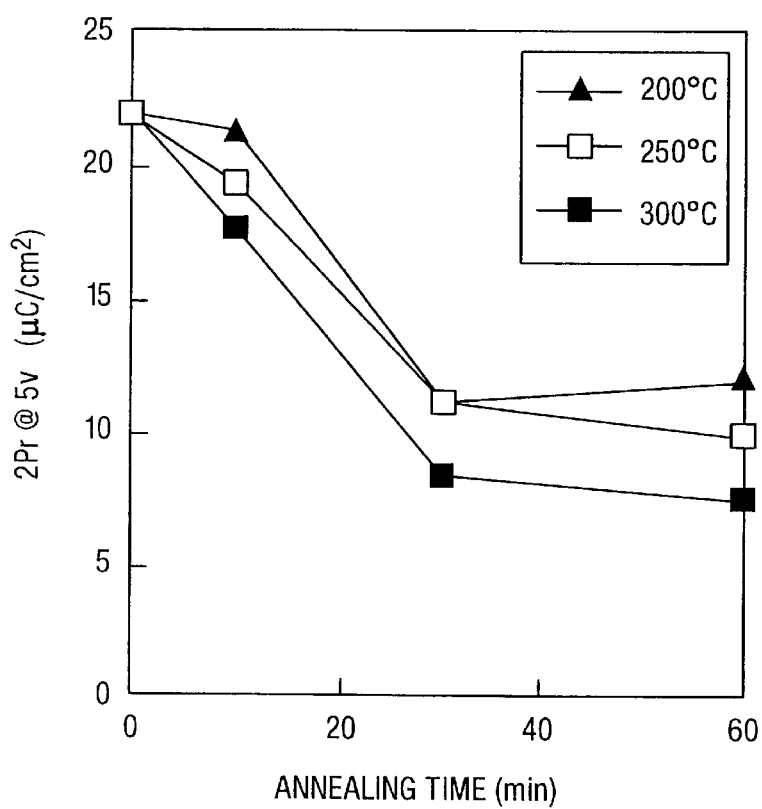
FIG. 5 is a graph of remanent polarization, 2Pr@ 5V, plotted as a function of annealing time in strontium bismuth tantalum niobate capacitors annealed at three different annealing temperatures.

FIG. 5 is a graph of remanent polarization, 2Pr, at 5 volts as a function of annealing time in capacitors annealed at 200°, 250° and 300° C. FIG. 5 shows that hydrogen heat treatment at the lowest temperature, 200° C., and the shortest duration, 10 minutes, results in the least degradation of 2Pr value.

Figure 6:
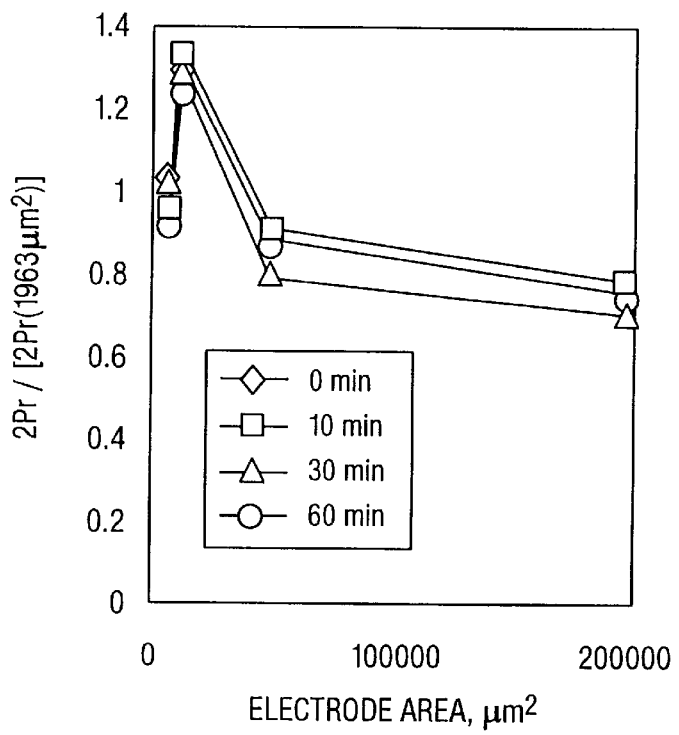
FIG. 6 is a graph of normalized remanent polarization, $2Pr/[2Pr(1963 \mu m^2)]$, at 5 V, plotted as a function of capacitor electrode area for four different hydrogen annealing times.

Remanent polarization was measured in capacitors with a surface area ranging from 1963 to 196300 $\mu m^2$. The data are plotted in the graph of FIG. 6. The vertical axis in FIG. 6 is normalized to 2Pr of 1963 $\mu Mm^2$. The data show that degradation of 2Pr does not depend on capacitor size. Therefore, hydrogen diffusion from the capacitor edge is not a dominant factor of degradation under the experimental conditions. This does not mean that lateral diffusion of hydrogen is insignificant or nonexistent. Rather, it suggests that if the top surfaces of the ferroelectric element in an integrated circuit are protected against hydrogen diffusion, then this could be significantly effective in preserving the electronic properties of the ferroelectric element, even if the sides of the ferroelectric element are not protected against lateral hydrogen diffusion in the ferroelectric thin film between the electrodes. The experiments in Example 6, below, tested the effectiveness of titanium nitride layers deposited above the ferroelectric thin film in capacitors without side protection against lateral diffusion of hydrogen.

The current density of the samples annealed at 200° C. for 10 minutes was about $10^{-7}$ A/cm$^2$ at 5 volts, equivalent to the value before annealing, and satisfactory for use in memory devices. The leakage current in the other samples, however, was unsatisfactorily high. Optical observation of the hydrogen heat-treated capacitors showed that partial peeling of the top electrode occurred in all samples except for those annealed at 200° and 250° C. for 10 minutes.

EXAMPLE 2

Oxygen annealing was performed on the capacitor samples that were subjected to hydrogen heat treatment in Example 1. The samples were annealed in $O_2$-gas at a flow rate of 5 l/m, at temperatures of 200°, 300°, 400° and 800° C. for one hour. Measurements were performed on three samples for each experimental condition. The remanent polarization and the coercive field were measured at 5 volts, and the current density was measured between 0 and 10 volts. In the samples in which oxygen recovery annealing was done at 800° C., the electronic properties of the strontium bismuth tantalum niobate capacitors recovered practically completely from the degradation caused earlier by hydrogen treatment. But, the electronic properties in samples annealed in oxygen at 200°, 300°, and 400° C., although showing some recovery, recovered less than desired for use in integrated circuits.

EXAMPLE 3

The mole ratio Nb/Ta in the strontium bismuth tantalum niobate precursor solution was varied to study its effect on electronic properties of the capacitor before and after $H_2$-gas annealing at 200° C. for 10, 30 and 60 minutes. Strontium bismuth tantalate and strontium bismuth niobate precursor solutions produced by Kojundo Chemical Corporation were mixed to make a final precursor. Their respective product numbers were 34611F and 950234. The solutions were mixed as indicated in Table 1 to produce a specific stoichiometric composition and Nb/Ta mole ratio in the final precursor solution. The capacitors were fabricated using the process of Example 1.

TABLE 1

| Strontium bismuth tantalate (ml) | Strontium bismuth niobate (ml) | n-butylacetate (ml) | Precursor stoichiometry | Nb/Ta mole ratio |
|---|---|---|---|---|
| 1.2 | 0 | 0.8 | $SrBi_{2.18}Ta_2O_9$ | 0 |
| 0.864 | 0.336 | 0.8 | $SrBi_{2.18}Ta_{1.44}Nb_{0.56}O_9$ | 0.4 |
| 0.6 | 0.6 | 0.8 | $SrBi_{2.18}Ta_{1.0}Nb_{1.0}O_9$ | 1.0 |
| 0.24 | 0.96 | 0.8 | $SrBi_{2.18}Ta_{0.4}Nb_{1.6}O_9$ | 4 |
| 0 | 1.2 | 0.8 | $SrBi_{2.18}Nb_2O_9$ | no Ta |

Figure 7:
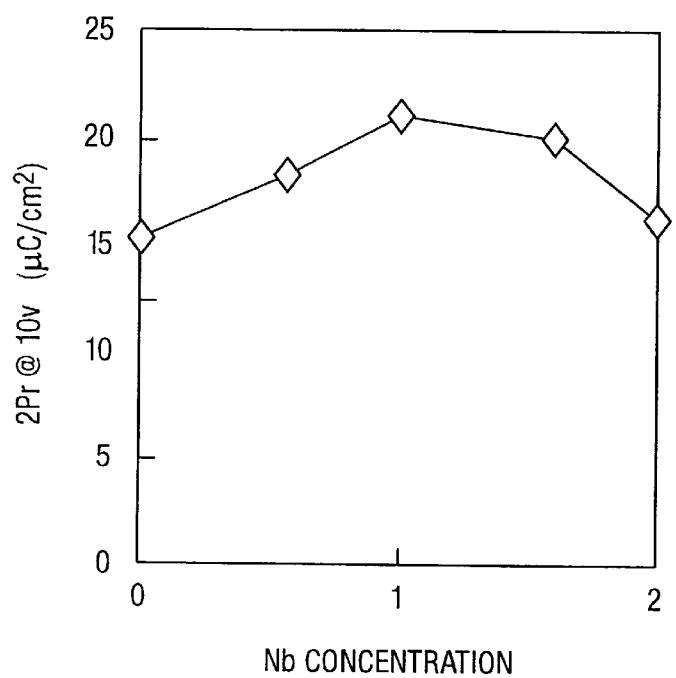
FIG. 7 is a graph of remanent polarization, 2Pr, before hydrogen annealing, measured at 10 volts in strontium bismuth tantalum niobate capacitors plotted as a function of Nb-concentration in terms of the stoichiometric formula subscript of niobium as the Nb/Ta mole ratio in the precursor is varied.
Figure 8:
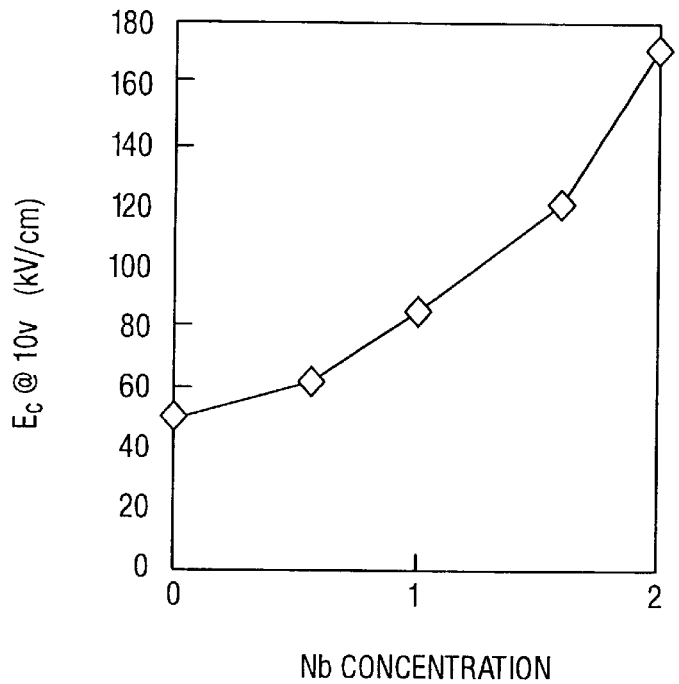
FIG. 8 is a graph of the coercive field, $E_C$, before hydrogen annealing, for strontium bismuth tantalum niobate capacitors plotted as a function of Nb-concentration in terms of the stoichiometric formula subscript of niobium as the Nb/Ta mole ratio in the precursor is varied.
Figure 9:
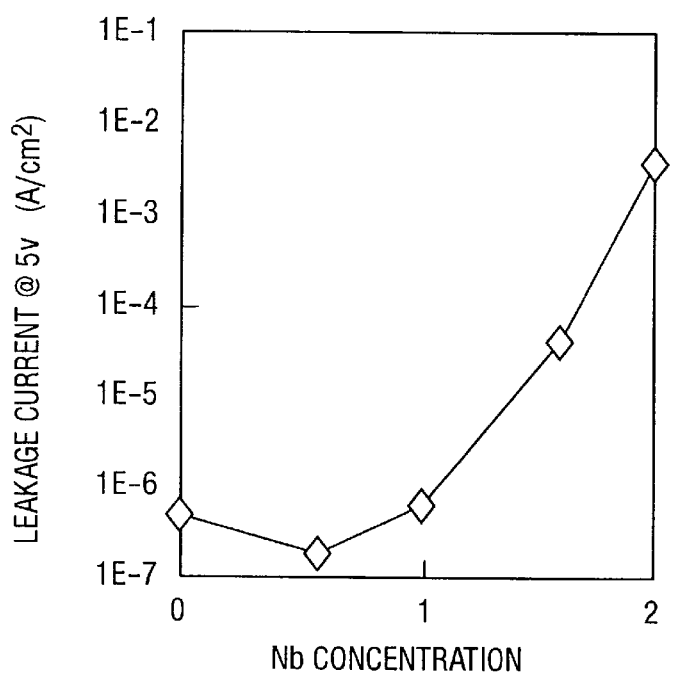
FIG. 9 is a graph of leakage current, $A/cm^2$, before hydrogen annealing, in strontium bismuth tantalum niobate capacitors measured at 5 volts plotted as a function of Nb-concentration in terms of the stoichiometric formula subscript of niobium as the Nb/Ta mole ratio in the precursor is varied.

Measurements were performed on three samples for each experimental condition. The capacitors each had an area of 7845 $\mu m^2$. The values of the electronic properties of the capacitors made from precursors with the compositions in Table 1 were measured before $H_2$-annealing and are plotted in the graphs of FIGS. 7–9. FIG. 7 is a graph of remanent polarization in microcoulombs per centimeter squared ($\mu C/cm^2$) measured at 10 volts in the strontium bismuth tantalum niobate capacitors plotted as a function of niobium concentration in terms of the stoichiometric formula subscript of niobium as the Nb/Ta ratio in the precursor is varied. It shows a maximum 2Pr value at around Nb=1. Nevertheless, the value of 2Pr at Nb=2 is questionable because of the large increase in coercive field at the high Nb-value, as shown in FIG. 8. FIG. 8 contains a graph of the coercive field, $E_C$, in kilovolts per centimeter (kV/cm), plotted as a function of niobium concentration in terms of the stoichiometric formula subscript of niobium as the Nb/Ta ratio in the precursor is varied. FIG. 8 shows that EC increases significantly with Nb-concentration. FIG. 9 is a graph of leakage current in amperes per centimeter squared ($A/cm^2$) measured at 5 volts plotted as a function of niobium concentration in terms of the stoichiometric formula subscript of niobium as the Nb/Ta ratio in the precursor is varied. FIG. 9 shows a minimum leakage current around Nb=0.56. The leakage current in the samples with $Nb \geq 1.6$ is too large for most circuit applications.

Figure 10:
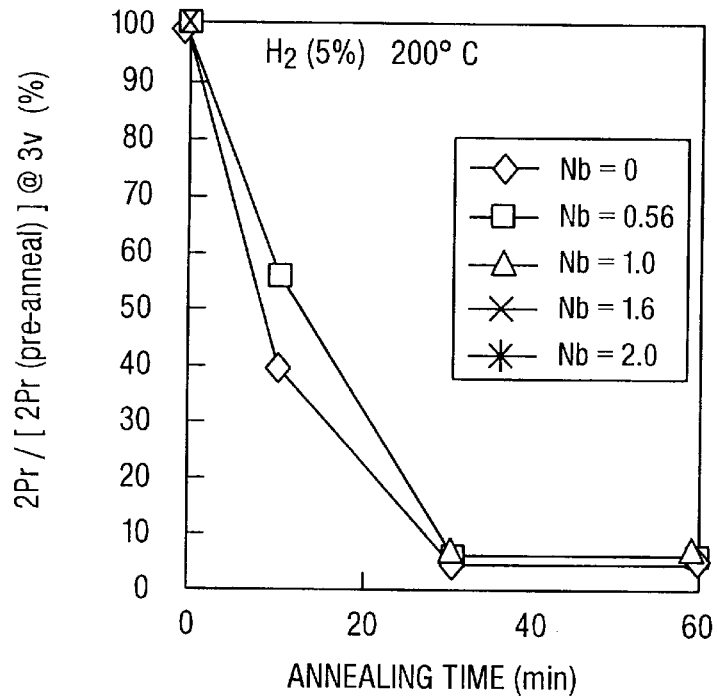
FIG. 10 is a graph of normalized remanent polarization, 2Pr/[2Pr(preanneal)], measured at 3 volts, plotted as a function of annealing time at 200° C. for strontium bismuth tantalum niobate capacitors made from precursors with different Nb/Ta mole ratios, expressed in terms of the stoichiometric formula subscript of niobium.
Figure 11:
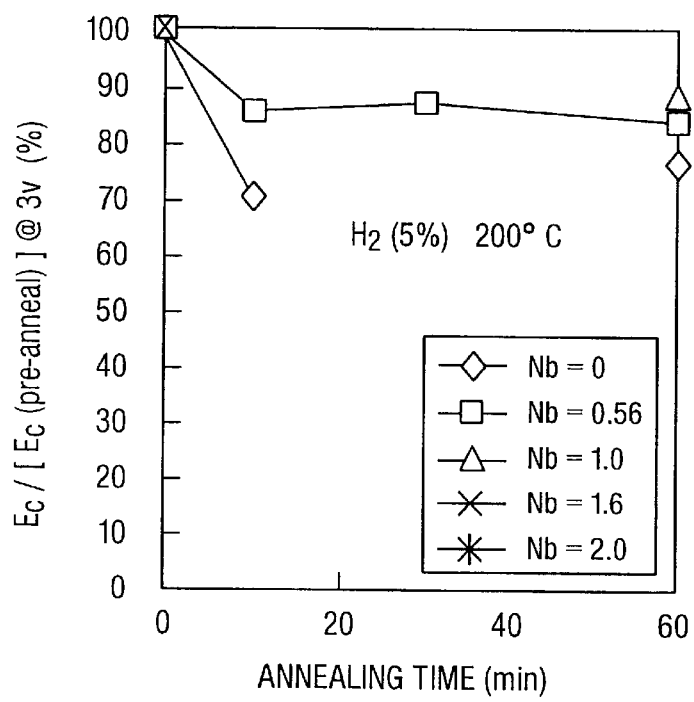
FIG. 11 is a graph of normalized coercive field, $E_C/[E_C$ (pre-anneal)], at 3 volts plotted as a function of annealing time at 200° C. of various strontium bismuth tantalum niobate capacitors made from precursors with different Nb/Ta mole ratios, expressed in terms of the stoichiometric formula subscript of niobium.
Figure 12:
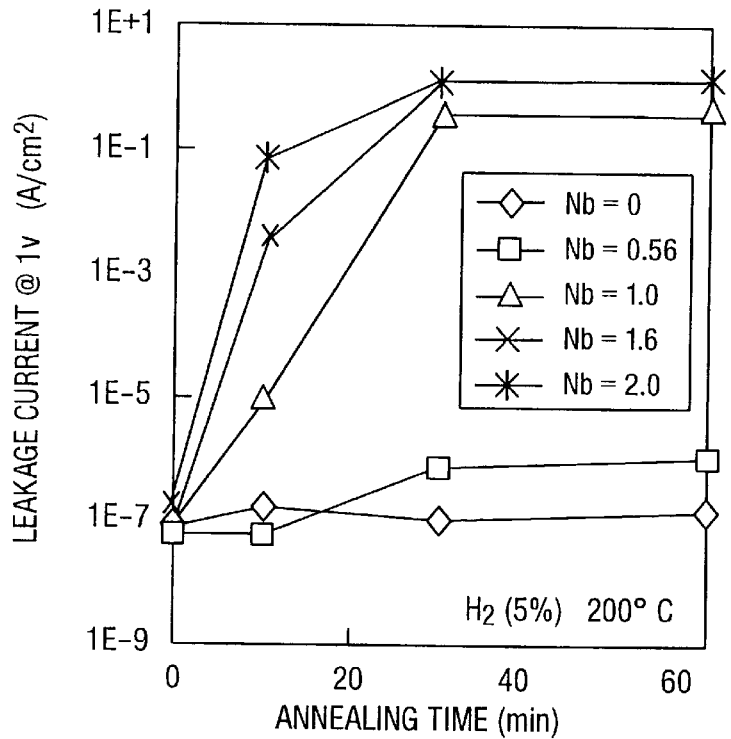
FIG. 12 is a graph of leakage current, measured at 1 volt, plotted as a function of annealing time at 200° C. for various strontium bismuth tantalum niobate capacitors made from precursors with different Nb/Ta mole ratios, expressed in terms of the stoichiometric formula subscript of niobium.

The effects of $H_2$-annealing are shown in FIGS. 10–12. The samples were annealed in $H_2(5\%)$-$N_2$ ambient at 200° C. for 10, 30 and 60 minutes. FIG. 10 is a graph of normalized remanent polarization, 2Pr/[2Pr(pre-anneal)], measured at 3 volts, plotted as a function of hydrogen annealing time at 200° C. In samples with $Nb \geq 0.56$ annealed 10 minutes, the 2Pr-value degraded about 45 percent. The degradation was greater in samples with Nb=0 or longer annealing times. For example, the degradation of remanent polarization was about 60% in the sample with Nb=0, annealed 10 minutes. Degradation was almost complete in all samples annealed for 30 or 60 minutes. FIG. 11 is a graph of normalized coercive field, $E_C/E_C$(pre-anneal), at 3 volts plotted as a function of hydrogen annealing time at 200° C. It shows that the presence of niobium in the ferroelectric precursor inhibits degradation of the $E_C$-value. FIG. 12 is a graph of leakage current measured at 1 volt plotted as a function of hydrogen annealing time in capacitors made from precursors with different Nb/Ta ratios, indicated by the stoichiometric formula subscript of niobium. The leakage current for Nb=0 and Nb=0.56 is about $10^{-7}$ $A/cm^2$, which is satisfactory for many circuit applications. The leakage current in capacitors where $Nb \geq 1.0$ is too high for most applications.

Comparison of the various data shows that the best precursor Nb-concentration for maximizing the electronic properties of strontium bismuth tantalum niobate capacitors is about Nb=0.56 where Ta=1.44, which corresponds to a Nb/Ta mole ratio of about 0.4.

EXAMPLE 4

The effect of adding excess bismuth to the standard strontium bismuth tantalum niobate ferroelectric precursor solution was studied. Strontium bismuth tantalum niobate capacitors containing added bismuth beyond that in the standard formula were prepared using the same strontium bismuth tantalum niobate solution and procedure as in Example 1, except that a 0.5 mol/l solution of Bi-ethylhexanoate in orthoxylene was prepared and used to add bismuth to strontium bismuth tantalum niobate precursor solutions. Table 1 shows the stoichiometry of the respective precursor solutions.

TABLE 2

| Strontium bismuth tantalum niobate (ml) | Bi solution (ml) | n-butylacetate (ml) | Precursor stoichiometry | Added Bi (%) |
|---|---|---|---|---|
| 3 | 0 | 2 | $SrBi_{2.18}Ta_{1.44}Nb_{0.56}O_9$ | 0.00 |
| 3 | 0.24 | 2 | $SrBi_{2.38}Ta_{1.44}Nb_{0.56}O_9$ | 10 |
| 3 | 0.48 | 2 | $SrBi_{2.58}Ta_{1.44}Nb_{0.56}O_9$ | 20 |

Figure 13:
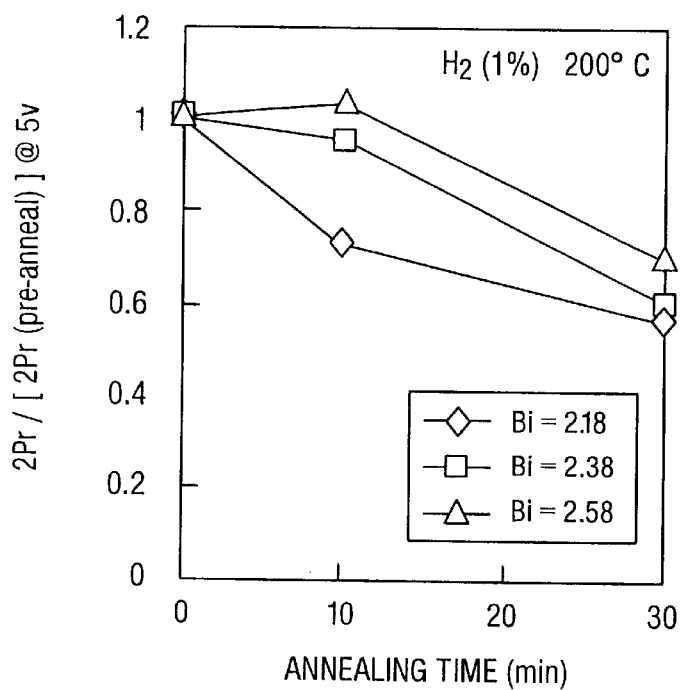
FIG. 13 is a graph of normalized remanent polarization, 2Pr /[2Pr(preanneal)], at 5 V, plotted as a function of hydrogen annealing time at 200° C. for strontium bismuth tantalum niobate capacitors made from precursors having three different bismuth concentrations, expressed in terms of the stoichiometric formula subscript of bismuth.
Figure 14:
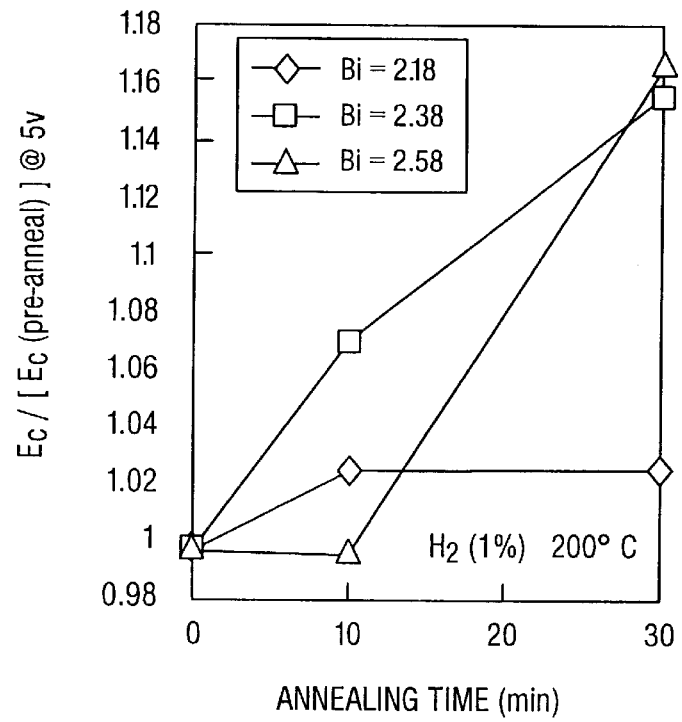
FIG. 14 is a graph of normalized coercive field, $E_C/[E_C$ (pre-anneal)], at 5 V plotted as a function of hydrogen annealing time for strontium bismuth tantalum niobate capacitors made from precursors having three different bismuth concentrations, expressed in terms of the stoichiometric formula subscript of bismuth.

The capacitors were subjected to hydrogen annealing in $H_2$-$N_2$ ($H_2$ 1%) at 200° C. for 10, 30, and 60 minutes. Remanent polarization, coercive field and I–V measurements were performed on three capacitors for each experimental condition. FIG. 13 is a graph of normalized remanent polarization, 2Pr/[2Pr(preanneal)], at 5 volts, plotted as a function of hydrogen annealing time at 200° C. for varied bismuth concentrations. FIG. 14 is a graph of normalized coercive field, $E_C/[E_C(\text{pre-anneal})]$, at 5 V plotted as a function of hydrogen annealing time at 200° C. for varied bismuth concentrations. Additional Bi inhibited the degradation of $2P_r$. Additional Bi caused the coercive field to increase within a relatively small range. Data for the samples annealed in hydrogen for 60 minutes are not shown because they were very leaky and the hysterisis curves could not be obtained.

Figure 15:
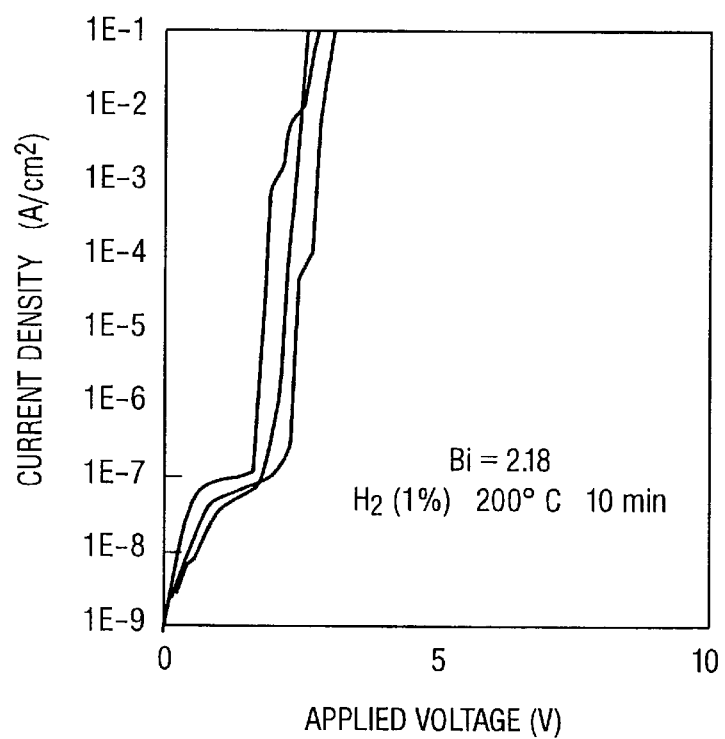
FIG. 15 is a graph of current density in $A/cm^2$ versus applied voltage in volts in strontium bismuth tantalum niobate capacitors with a standard amount of bismuth after 10 minutes hydrogen annealing time at 200° C.
Figure 16:
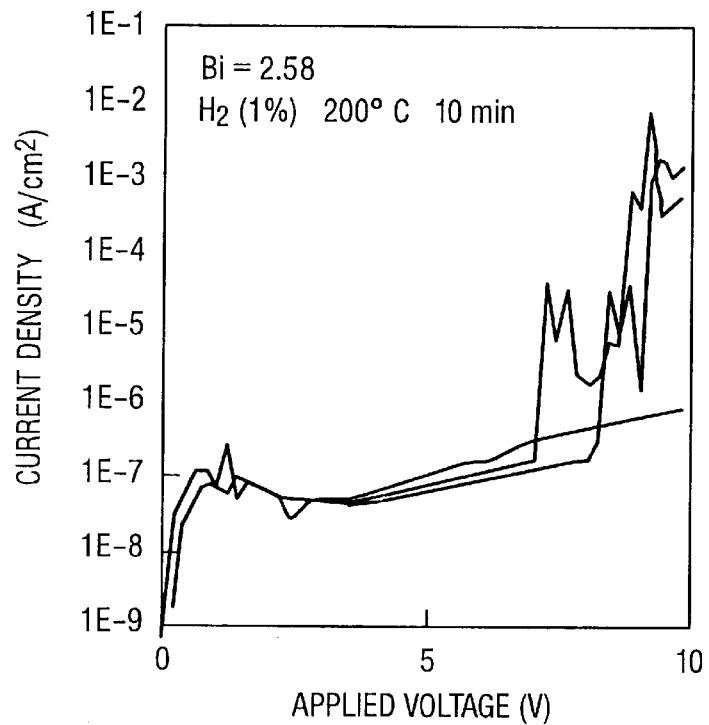
FIG. 16 is a graph of current density in $A/cm^2$ versus applied voltage in volts in strontium bismuth tantalum niobate capacitors with an added amount of bismuth above the standard formula after 10 minutes hydrogen annealing time at 200° C.
Figure 17:
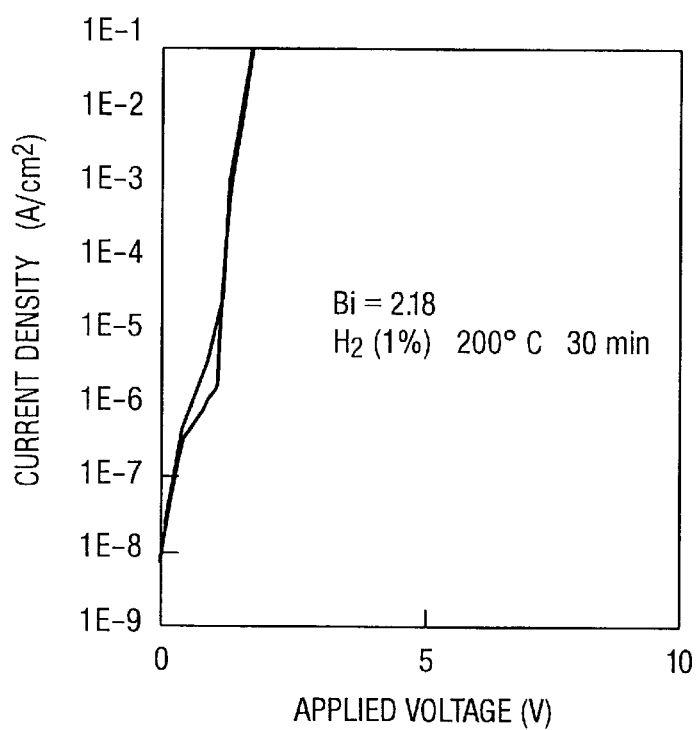
FIG. 17 is a graph of current density in $A/cm^2$ versus applied voltage in volts in strontium bismuth tantalum niobate capacitors with a standard amount of bismuth after 30 minutes hydrogen annealing time at 200° C.

The current-voltage (I–V) characteristics, that is the current density in amperes per square centimeter versus the applied voltage in volts, of the samples of Bi=2.18 and 2.58 annealed in hydrogen for 10 minutes are shown in FIGS. 15–16. A corresponding graph of the data for Bi=2.18 annealed for 30 minutes is shown in FIG. 17. The capacitor samples with Bi=2.58 annealed for 30 minutes short circuited, so the data was not plotted. FIGS. 15 and 16 show that additional Bi above the standard formula improves leakage current of the 10-minute samples. In contrast, the high current measured in the sample with B=2.58 annealed for 30 minutes shows that added bismuth actually makes the leakage current due to hydrogen degradation more acute.

The data indicate two things. Firstly, it is advantageous to have excess bismuth in the precursor from which a ferroelectric element is formed. But, if the integrated circuit requires hydrogen annealing for a time period significantly longer than 10 minutes, then excess bismuth might have a negative effect on the leakage current. If a long annealing time is required, then other steps included in this invention should be applied instead of using excess bismuth. For example, the steps of forming a hydrogen barrier layer or performing an oxygen recovery anneal might be applied. Secondly, it is clear that the final strontium bismuth tantalum niobate thin film from the precursor with the ratio of elements represented by the formula $SrBi_{2.58}Ta_{1.44}Nb_{0.56}O_9$ must include excess bismuth, since this amount of excess bismuth could not dissipate during the fabrication process. This is also most likely true for the precursor with the ratio of elements represented by the formula $SrBi_{2.38}Ta_{1.44}Nb_{0.56}O_9$. Thus, these results indicate that excess metal in the final thin film (not just the precursor) can be a desirable feature, depending on the particular conditions of a fabrication process.

EXAMPLE 5

The effect of adding excess niobium to the standard strontium bismuth tantalum niobate ferroelectric precursor solution was studied. Capacitors were fabricated from a strontium bismuth tantalum niobate solution commercially available from Hughes Aircraft Company. The standard solution contained chemical precursors in the stoichiometric ratio expressed in the formula $SrBi_{2.18}Ta_{1.44}Nb_{0.56}O_9$. The 0.2 mol/l solution contained: tantalum 2-ethylhexanoate, bismuth 2-ethylhexanoate, strontium 2-ethylhexanoate, niobium 2-ethylhexanoate, 2-ethylhexanoate, and xylene. The strontium bismuth tantalum niobate capacitors were perpared according to the procedure of Example 1, except that a 0.04 mol/l solution of Nb-ethylhexanoate in orthoxylene was prepared and used to add excess niobium to the ferroelectric precursor. Table 3 shows the composition of the precursors.

TABLE 3

| Strontium bismuth tantalum niobate (ml) | diluted Nb solution (ml) | n-butylacetate (ml) | Precursor stoichiometry | Added Nb (%) |
| --- | --- | --- | --- | --- |
| 3 | 0 | 2 | $SrBi_{2.18}Ta_{1.44}Nb_{0.56}O_9$ | 0 |
| 3 | 0.6 | 2 | $SrBi_{2.18}Ta_{1.44}Nb_{0.60}O_9$ | 7 |
| 3 | 0.9 | 1.4 | $SrBi_{2.18}Ta_{1.44}Nb_{0.62}O_9$ | 11 |
| 3 | 1.2 | 0.8 | $SrBi_{2.18}Ta_{1.44}Nb_{0.64}O_9$ | 14 |
| 3 | 1.5 | 0.5 | $SrBi_{2.18}Ta_{1.44}Nb_{0.66}O_9$ | 18 |

Figure 18:
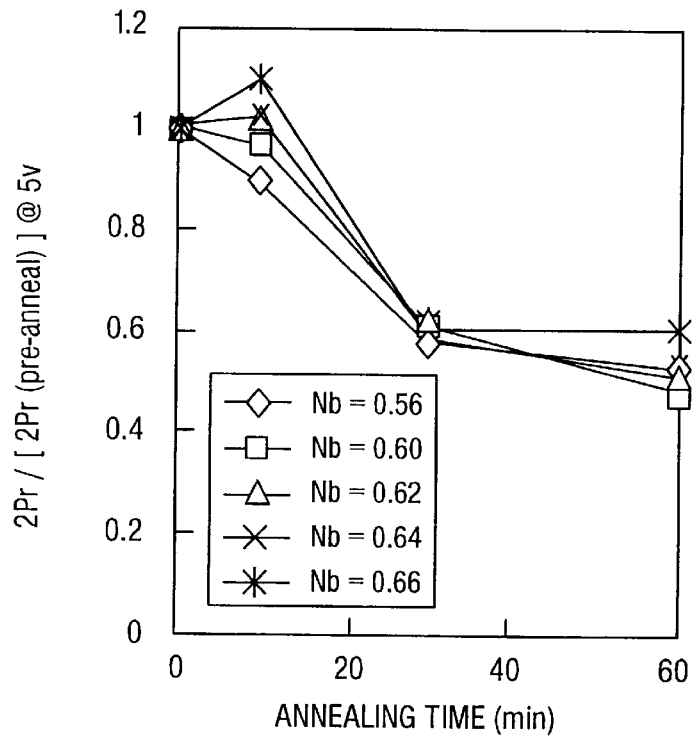
FIG. 18 is a graph of normalized remanent polarization, 2Pr/[2Pr(preanneal)], at 5 V, plotted as a function of hydrogen annealing time at 200° C. for strontium bismuth tantalum niobate capacitors made from precursors with varied niobium concentrations, expressed in terms of the stoichiometric formula subscript of niobium.
Figure 19:
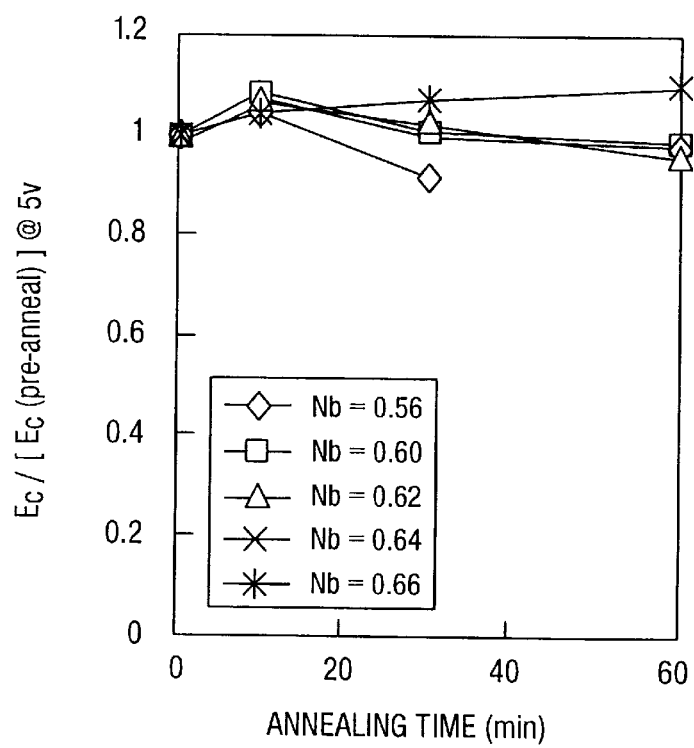
FIG. 19 is a graph of normalized coercive field, $E_C/[E_C$ (pre-anneal)], at 5 V, plotted as a function of hydrogen annealing time at 200° C. for strontium bismuth tantalum niobate capacitors made from precursors with varied niobium concentrations, expressed in terms of the stoichiometric formula subscript of niobium.

The capacitors were annealed in hydrogen under the same conditions as in Example 4. Measurements were performed on three capacitors for each experimental condition. The dependence of remanent polarization (2Pr) and coercive field ($E_C$) at 5 V on hydrogen annealing time is shown in the graphs of FIGS. 18 and 19, respectively. FIG. 18 is a graph of normalized remanent polarization, 2Pr/[2Pr(pre-anneal)], at 5 volts, plotted as a function of hydrogen annealing time at 200° C. for capacitors made from precursors with varied niobium concentrations, expressed in terms of the stoichiometric formula subscript of niobium. FIG. 19 is a graph of normalized coercive field, $E_C/[E_C(\text{pre-anneal})]$, at 5 volts plotted as a function of hydrogen annealing time at 200° C. for varied niobium concentrations. Excess Nb inhibited the degradation of 2Pr. That is, the larger the amount of Nb, the less the remanent polarization degraded. For Nb=0.66, the remanent polarization actually increased slightly for short anneal times. Similarly, FIG. 19 shows that excess niobium tends to prevent decrease of the coercive field value. Since niobium does not form volatile gases that escape during fabrication, the final, solid, strontium bismuth tantalum niobate thin film must contain excess niobium. This shows that excess amounts of other metals in addition to bismuth, is desirable. In particular, it is evident that excess amounts of a B-site element are particularly effective in preventing the degradation of electronic properties in a layered superlattice material upon exposure to hydrogen.

Figure 20:
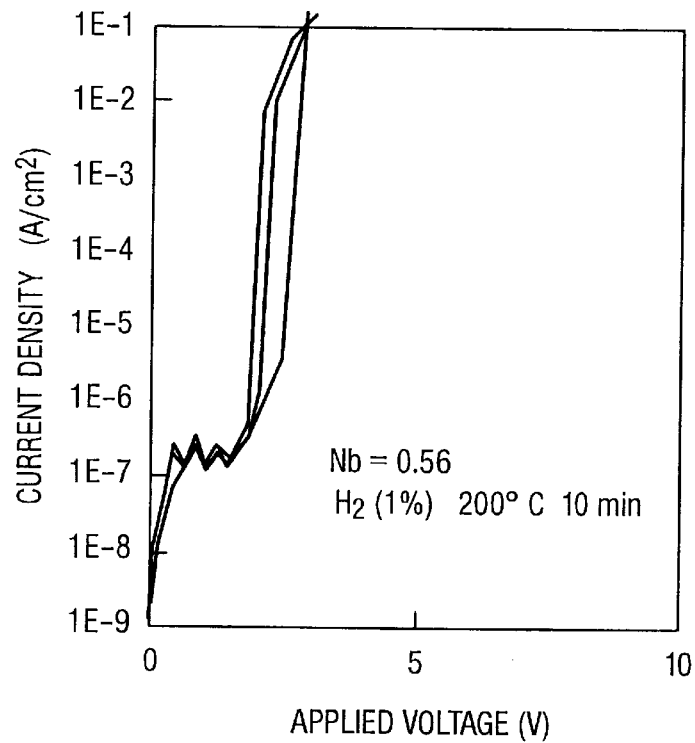
FIG. 20 is a graph of current density in A/cm$^2$ versus applied voltage in volts for strontium bismuth tantalum niobate capacitors made from a precursor containing a standard amount of niobium after 10 minutes hydrogen annealing time at 200° C.
Figure 21:
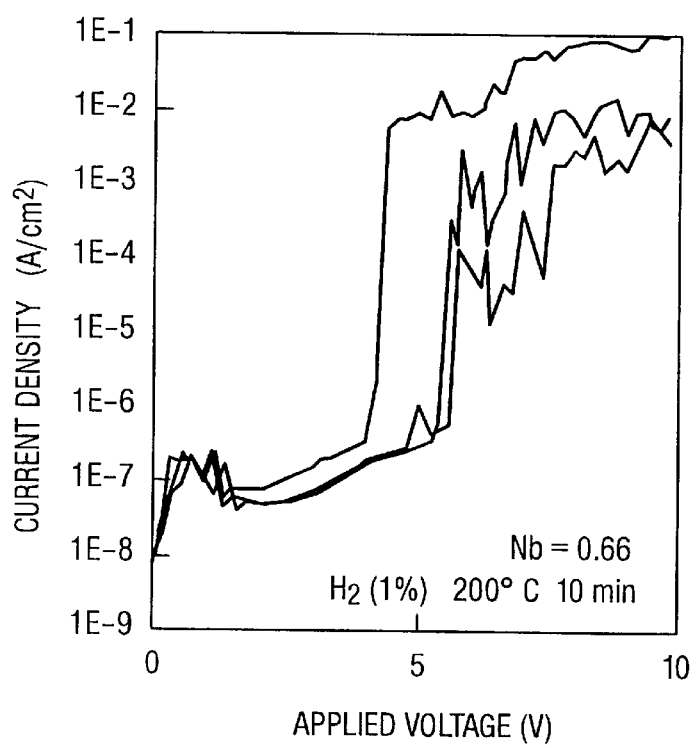
FIG. 21 is a graph of current density in A/cm$^2$ versus applied voltage in volts for strontium bismuth tantalum niobate capacitors made from a precursor containing an added amount of niobium after 10 minutes hydrogen annealing time at 200° C.
Figure 22:
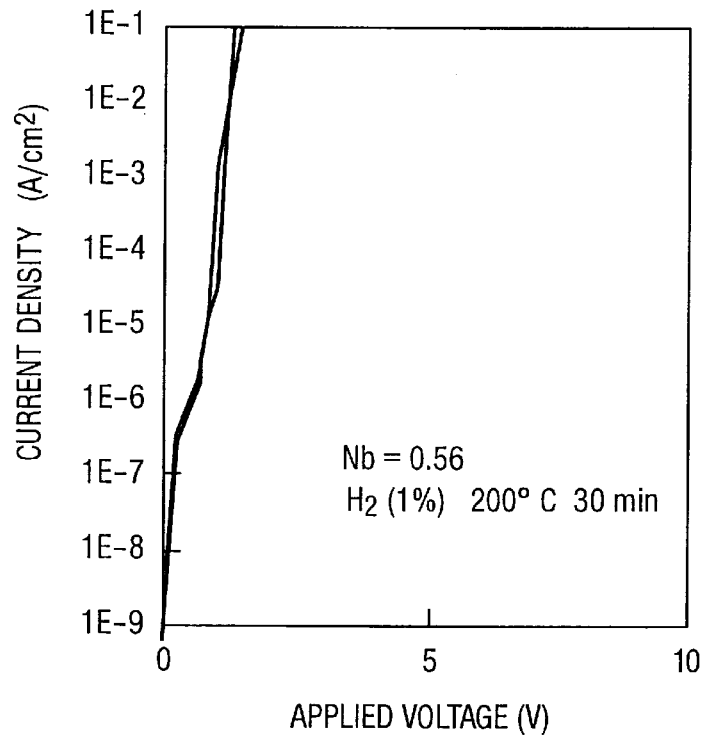
FIG. 22 is a graph of current density in Acm$^2$ versus applied voltage in volts for strontium bismuth tantalum niobate capacitors made from a precursor containing a standard amount of niobium after 30 minutes hydrogen annealing time at 200° C.
Figure 23:
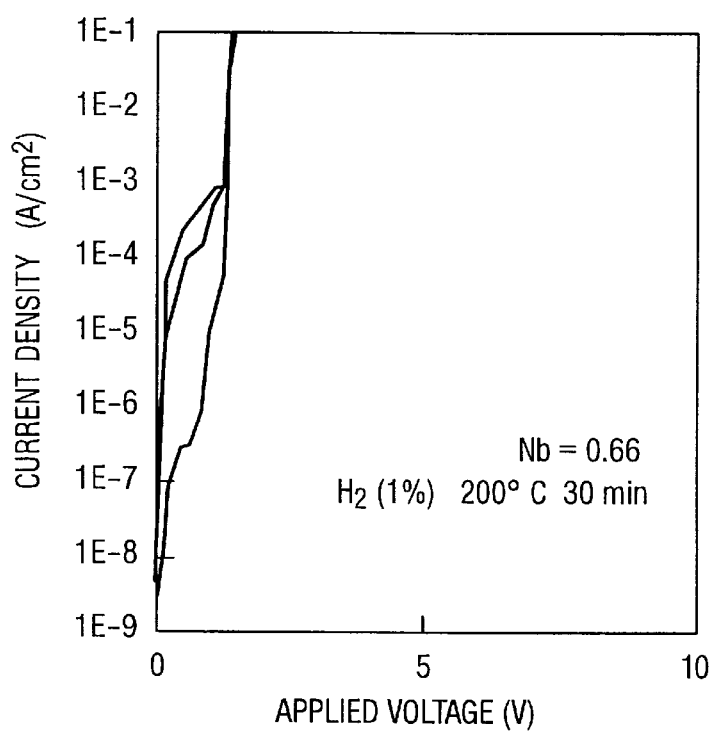
FIG. 23 is a graph of current density in A/cm$^2$ versus applied voltage in volts for strontium bismuth tantalum niobate capacitors made from a precursor containing an added amount of niobium after 30 minutes hydrogen annealing time at 200° C.

The I–V characteristics of the samples annealed for 10 and 30 minutes with Nb=0.56 and 0.66 are shown in FIGS. 20–23. Three capacitors were measured for each experimental condition. FIG. 20 is a graph of current density in A/cm$^2$ versus applied voltage in volts, in a strontium bismuth tantalum niobate capacitor with a standard amount of niobium (precursor Nb=0.56) after 10 minutes hydrogen annealing time at 200° C. The graph shows that leakage current in the range 3–5 volts is possibly too high for many applications. FIG. 21 is a graph of current density in A/cm$^2$ versus applied voltage in volts in a strontium bismuth tantalum niobate capacitor with an additional amount of niobium (precursor Nb=0.66) after 10 minutes hydrogen annealing time at 200° C. The leakage current in the range 3–5 volts is about 10$^{-7}$/cm$^2$, satisfactory for many applications. Comparison of the graphs of FIGS. 20 and 21 indicates that the increased niobium concentration in the layered superlattice compound protects the layered superlattice compound with respect to current density during short hydrogen annealing times. FIG. 22 is a graph of current density in A/cm$^2$ versus applied voltage in volts in a strontium bismuth tantalum niobate capacitor with a standard amount of niobium after 30 minutes hydrogen annealing time at 200° C. FIG. 23 is a graph of current density in A/cm$^2$ versus applied voltage in volts in a strontium bismuth tantalum niobate capacitor with an additional amount of niobium (precursor Nb=0.66) after 30 minutes hydrogen annealing time at 200° C. Comparison of FIGS. 22 and 23 indicates that excess niobium does not protect the layered superlattice compound with respect to current density when the hydrogen annealing time is equal to or greater than 30 minutes. In summary, leakage current decreased in samples with additional Nb annealed 10 minutes; however, the curves show essentially no difference in leakage current with additional Nb as compared to the standard formula when the annealing time was 30 minutes.

The results of Examples 4 and 5 show that additional Bi or Nb protects the strontium bismuth tantalum niobate capacitor against degradation by hydrogen annealing. These additional elements form additional oxides, and they inhibit hydrogen degradation probably by consuming hydrogen that would otherwise reduce the active strontium bismuth tantalum niobate oxides. The high leakage in capacitors annealed at longer times seems to be caused by the additional oxide that is consumed by hydrogen. Upon its reduction by hydrogen annealing, the additional oxide forms elemental metals in the ferroelectric capacitor. The conductive metals then act as a leakage path. This suggests that the preferred fabrication process will use sufficient excess metal to get significant hydrogen when it forms oxide, but not enough to provide a leakage path when it is reduced by hydrogen. Alternatively, an oxygen recovery anneal may be performed as described in Example 2 above sufficient to reoxidize the metal to form an insulator.

Preliminary results with other B-site materials, such as titanium, tantalum, hafnium, tungsten and zirconium, indicates that excess amounts of other B-site materials will also inhibit the degradation resulting from exposure to hydrogen.

EXAMPLE 6

The effect of covering the platinum top electrode of strontium bismuth tantalum niobate capacitors with a hydrogen barrier made of titanium nitride was studied. Strontium bismuth tantalum niobate capacitors were again prepared according to the procedure used in Example 1 from precursor solution obtained from Hughes Aircraft Company, HAC10709-30. Then, thin films of titanium nitride were sputter deposited about 1800 Å thick on the strontium bismuth tantalum niobate capacitors at various deposition conditions and annealed in ambient $H_2$-$N_2$ ($H_2$5%) mixture with a flow rate of 4 l/m at 400° C. for 10, 30 and 60 minutes. The capacitors had an area of 7845 $\mu m^2$. The Titanium nitride films were removed by a solution of $NH_4OH$:$H_2O_2$:$H_2O$ (1:3:1) at 60° C. After drying of the capacitors in a vacuum oven, hysterisis measurements over the range of 1 to 10 volts and I–V tests were conducted.

The Titanium nitride films were deposited on the top electrode of the capacitors using a Titanium nitride sputter target with argon gas at gas pressures of 5, 8 and 12 mTorr and at 25, 50 and 100 W power, base pressure $5\times10^{-7}$ Torr. The Titanium nitride films most effective in protecting the strontium bismuth tantalum niobate capacitors against hydrogen degradation were the films with highest density, that is, the films produced at 100 W and 5 mTorr. These films had a density of 4.19 grams per cubic centimeter (g/cm) and an electrical resistivity of about 0.50 milliohms per centimeter (mΩcm). The sides of the capacitors were not coated with barrier layers.

The hysterisis curves of samples in which the titanium nitride layer was sputtered at 100 W and 5 mTorr were measured before hydrogen annealing and after hydrogen annealing at 10, 30, and 60 minutes. The curves were almost the same even after 60 minutes of annealing as before annealing. The remanent polarization, 2Pr, in capacitors with the titanium nitride layer sputtered at 100 W and 5 mTorr was measured at 5 volts before hydrogen annealing and after hydrogen annealing at 10, 30 and 60 minutes. The values of 2Pr in all the $H_2$-annealed samples degraded only about 10% from the values before $H_2$-treatment. The leakage currents of capacitors in which the titanium nitride layer was sputtered at 100 W and 5 mTorr were measured before hydrogen annealing and after hydrogen annealing at 10, 30, and 60 minutes. The leakage current measured at 3 volts was approximately equal in all the samples that had undergone hydrogen annealing. The value was only about $10^{-6}$ A/cm$^2$. These results show the benefit of providing a nitride hydrogen barrier in the inventive method. They also demonstrate that significant protection of the desirable electronic properties of the ferroelectric thin film against hydrogen degradation can be achieved by applying a hydrogen barrier layer vertically above the ferroelectric thin film, without necessarily having to protect the bottom and sides of the ferroelectric element. In Example 1 above, the results indicated that lateral diffusion of hydrogen is relatively much less significant than vertical diffusion. Since, in most cases, the layers below the ferroelectric layer are sufficiently thick to prevent hydrogen diffusion to the ferroelectric, the most important hydrogen barrier is a barrier that is deposited in one of the layers directly over the ferroelectric thin film. By "directly over" means that the barrier layer is above the ferroelectric layer in the vertical direction in FIGS. 1 and 4, and extends the length of the ferroelectric layer in the horizontal directions in FIGS. 1 and 4. The term does not mean that the barrier layer is in direct contact with the ferroelectric layer. The barrier layer may or may not contact the ferroelectric layer. As long as it is directly above a portion of the ferroelectric layer, it will protect that portion from hydrogen diffusion.

On the other hand, the results also clearly show that protection of the ferroelectric properties with only a top barrier layer is not complete. One possible approach to get better protection is to apply measures to protect the sides of the ferroelectric thin film against lateral diffusion.

As discussed above, a feature of the invention is to keep the exposure to hydrogen small, which includes exposures at temperatures under 350° C. and for times less than 30 minutes. For some integrated circuit devices, such low-temperature, short duration treatments with hydrogen will be sufficient to obtain good results. However, in other cases, to obtain MOSFETs with good electronic properties, or for other reasons, the exposures to hydrogen will necessarily be larger, that is of longer duration and/or at higher temperature. In such cases good ferroelectric properties can be obtained by using precursors with excess metal oxide, such as excess bismuth oxide and/or excess niobium oxide. Or, in other cases, the use of a hydrogen barrier during hydrogen treatments, either alone or in combination with the above measures, will be effective. In the case of the use of a hydrogen barrier, barriers that cover only the integrated circuit portion directly above the ferroelectric material that forms a part of an integrated circuit element are effective because lateral diffusion is much less significant than vertical diffusion from above. Further, use of additional oxygen in integrated circuit layers laid down subsequent to the ferroelectric layers, such as an insulating layer laid down subsequent to the fabrication of the ferroelectric layer, which oxygen acts as a getter for hydrogen during subsequent hydrogen treatments, can also be effectively used either alone or in combination with one or more of the above measures. In this manner, the invention provides processes and/or structures that enable the prevention of the degradation of ferroelectric elements in combination with almost any exposure to hydrogen that is necessary to create and perfect the other portions of the integrated circuit.

There has been described a method and structure for fabricating ferroelectric integrated circuits that permit exposure to hydrogen and still result in ferroelectric devices with good electrical properties. It should be understood that the particular embodiments shown in the drawings and described within this specification are for purposes of example and should not be construed to limit the invention which will be described in the claims below. For example, the invention contemplates that the layers 122, 422 in FIGS. 1 and 4 may be made of any layered superlattice material or $ABO_3$ type metal oxide. Further, it is evident that those skilled in the art may now make numerous uses and modifications of the specific embodiments described, without departing from the inventive concepts. For example, now that a low-temperature short-duration hydrogen treatment of the integrated circuit has been identified as an important part of the process for fabricating ferroelectric memory devices, this method can be combined with other processes to provide variations on the method described. It is also evident that the steps recited may in some instances be performed in a different order. Or equivalent structures and process may be substituted for the various structures and processes described. Consequently, the invention is to be construed as embracing each and every novel feature and novel combination of features present in and/or possessed by the fabrication processes, electronic devices, and electronic device manufacturing methods described.

We claim:

1. A method for fabricating an integrated circuit comprising the steps of:

forming an integrated circuit portion including a thin film of metal oxide material; and heating said integrated circuit portion in an atmosphere including hydrogen for a time period less than 30 minutes.

2. A method according to claim 1 and further comprising the step of conducting an oxygen recovery anneal after said step of heating in an atmosphere of hydrogen, said oxygen recovery anneal being performed at a temperature range from 625° C. to 1000° C. for a time period from 20 minutes to 2 hours.

3. A method according to claim 1 and further comprising the step of forming a hydrogen barrier layer directly over at least a portion of said thin film of ferroelectric metal oxide material before said step of heating.

4. A method according to claim 1 wherein said ferroelectric metal oxide material comprises an oxide compound containing at least two metals and wherein at least one of said metals is present in said material in an excess amount.

5. A method for fabricating an integrated circuit having a plurality of layers, comprising the steps of:

forming an integrated circuit portion including a thin film of ferroelectric metal oxide material; and heating said integrated circuit portion in an atmosphere including hydrogen at a temperature less than 350° C. for a time period not exceeding 30 minutes, wherein said heating does not result in depositing one of said layers.

6. A method according to claim 5 wherein said step of heating is provided for a time period less than 30 minutes.

7. A method according to claim 6 wherein said hydrogen comprises from 0.01 to 50 percent in volume of said atmosphere.

8. A method according to claim 6 and further comprising the step of forming a hydrogen barrier layer directly over at least a portion of said ferroelectric metal oxide material before said step of heating.

9. A method according to claim 8 wherein said hydrogen barrier layer comprises a nitride of titanium or silicon.

10. A method according to claim 5 wherein said ferroelectric metal oxide material comprises an oxide compound containing at least two metals and wherein at least one of said metals is present in said material in an excess amount.

11. A method according to claim 10 wherein said ferroelectric metal oxide material comprises a layered superlattice compound.

12. A method according to claim 11 wherein said metal present in an excess amount is either niobium or bismuth.

13. A method according to claim 12 wherein said layered superlattice compound comprises strontium bismuth tantalum niobate.

14. A method according to claim 13 wherein said metal present in an excess amount is niobium.

15. A method according to claim 5 wherein said step of forming comprises providing a substrate and a precursor liquid for said ferroelectric metal oxide material, applying said precursor to said substrate and treating it to form said ferroelectric metal oxide material, and further wherein said ferroelectric metal oxide material comprises an oxide compound containing at least two metals and wherein one of said metals is present in said precursor in an excess amount.

16. A method according to claim 15 wherein said metal present in an excess amount is a metal that does not form volatile compounds that dissipate during said fabrication process.

17. A method according to claim 5 wherein said step of forming comprises providing a substrate and a precursor liquid for said ferroelectric metal oxide material;

applying said precursor to said substrate;

and treating said precursor to form said ferroelectric metal oxide material, and further wherein said ferroelectric metal oxide material comprises strontium bismuth tantalum niobate and said precursor contains the chemical elements strontium, bismuth, tantalum and niobium having relative molar proportions corresponding approximately to the stoichiometric formula $SrBi_{2.18}Ta_{2-x}Nb_xO_9$, where $0 \leq x \leq 2$.

18. A method according to claim 17 wherein said precursor contains an additional amount of bismuth corresponding to between zero percent and 40 percent above the stoichiometric amount represented by the formula $SrBi_{2.18}Ta_{2-x}Nb_xO_9$, where $0 \leq x \leq 2$.

19. A method according to claim 17, wherein said precursor contains relative molar proportions of the elements strontium, bismuth, tantalum and niobium corresponding approximately to the formula $SrBi_{2.18}Ta_{1.44}Nb_{0.56}O_9$.

20. A method according to claim 19 wherein said precursor contains an additional amount of niobium corresponding to between zero percent and 40 percent above the stoichiometric amount represented by the formula $SrB_{2.18}Ta_{1.44}Nb_{0.50}O_9$.

21. A method according to claim 5 and further comprising the step of performing an oxygen recovery anneal after said step of heating in an atmosphere of hydrogen, said oxygen recovery anneal being performed at a temperature range from 625° C. to 1000° C. for a time period from 20 minutes to 2 hours.

22. A method of fabricating an integrated circuit that includes a thin film of ferroelectric metal oxide material, said method comprising the steps of:

forming a portion of said integrated circuit including said thin film of ferroelectric metal oxide material, said metal oxide material comprising a layered superlattice compound having an excess amount of a B-site element;

exposing said portion of said integrated circuit to hydrogen;

performing an oxygen recovery anneal at a temperature in the range of from 625° C. to 1000° C. for a time period from 20 minutes to 2 hours; and completing said integrated circuit to include said thin film of ferroelectric metal oxide material in a component of said integrated circuit.

23. A method according to claim 22 and further comprising the step of forming a hydrogen barrier layer directly over at least a portion of said ferroelectric metal oxide material before said step of exposing.

24. A method according to claim 23 wherein said hydrogen barrier layer comprises a nitride of titanium or silicon.

25. A method according to claim 22 wherein said layered superlattice compound comprises strontium bismuth tantalum niobate.

26. A method according to claim 25 wherein said metal present in an excess amount is niobium.

27. A method according to claim 26 wherein said layered superlattice compound comprises an excess amount of bismuth.

28. A method according to claim 22 wherein said step of forming comprises providing a substrate and a precursor liquid for said ferroelectric metal oxide material, applying said precursor to said substrate, and treating it to form said thin film of said ferroelectric metal oxide material.

29. A method for fabricating an integrated circuit comprising the steps of:

forming an integrated circuit portion including a thin film of metal oxide material; and heating said integrated circuit portion in an atmosphere including hydrogen at a temperature less than 350° C., wherein said heating is provided for a time period less than 30 minutes and the fraction of hydrogen in the hydrogen atmosphere is from 0.01 percent to 50 percent.

30. A method according to claim 29 and further comprising the step of forming a hydrogen barrier layer directly over at least a portion of said metal oxide material before said step of heating.

31. A method according to claim 30 wherein said hydrogen barrier layer comprises a nitride of titanium or silicon.

32. A method for fabricating an integrated circuit comprising the steps of:

forming an integrated circuit portion including a thin film of metal oxide material; and heating said integrated circuit portion in an atmosphere including hydrogen at a temperature less than 350° C., wherein said step of forming comprises providing a substrate and a precursor liquid for said metal oxide material;

applying said precursor to said substrate;

and treating said precursor to form said metal oxide material, and further wherein said metal oxide material comprises strontium bismuth tantalum niobate and said precursor contains the chemical elements strontium, bismuth, tantalum and niobium having relative molar proportions corresponding approximately to the stoichiometric formula $SrB_{2.18}Ta_{2-x}Nb_xO_9$, where $0<x<2$.

33. A method according to claim 32 wherein said precursor contains an additional amount of bismuth corresponding to between zero percent and 40 percent above the stoichiometric amount represented by the formula $SrBi_{2.18}Ta_{2-x}Nb_xO_9$, where $0\leq x\leq 2$.

34. A method according to claim 32 wherein said precursor contains relative molar proportions of the elements strontium, bismuth, tantalum and niobium corresponding approximately to the formula $SrBi_{2.18}Ta_{1.44}Nb_{0.56}O_9$.

35. A method according to claim 34 wherein said precursor contains an additional amount of niobium corresponding to between zero percent and 40 percent above the stoichiometric amount represented by the formula $SrBi_{2.18}Ta_{1.44}Nb_{0.56}O_9$.

* * * * *